United States Patent
Higuchi et al.

(10) Patent No.: US 10,236,401 B2
(45) Date of Patent: Mar. 19, 2019

(54) SOLAR CELL MODULE AND METHOD OF PRODUCING THE SAME

(71) Applicant: Panasonic Corporation, Osaka (JP)

(72) Inventors: Hiroshi Higuchi, Kyoto (JP); Takayuki Negami, Osaka (JP)

(73) Assignee: Panasonic Corporation, Osaka (JP)

( * ) Notice: Subject to any disclaimer, the term of this patent is extended or adjusted under 35 U.S.C. 154(b) by 19 days.

(21) Appl. No.: 15/655,963

(22) Filed: Jul. 21, 2017

(65) Prior Publication Data
US 2018/0040754 A1 Feb. 8, 2018

(30) Foreign Application Priority Data
Aug. 3, 2016 (JP) .................... 2016-152616

(51) Int. Cl.
*H01L 31/0465* (2014.01)
*H01L 31/046* (2014.01)
*H01L 31/0463* (2014.01)

(52) U.S. Cl.
CPC ........ *H01L 31/0465* (2014.12); *H01L 31/046* (2014.12); *H01L 31/0463* (2014.12)

(58) Field of Classification Search
CPC .......... H01L 31/046; H01L 31/0465; H01L 31/0463
See application file for complete search history.

(56) References Cited

U.S. PATENT DOCUMENTS

2009/0277499 A1  11/2009  Aoki et al.
2010/0186813 A1*  7/2010  Knoll ............. H01L 31/046
                                          136/256
(Continued)

FOREIGN PATENT DOCUMENTS

EP  2752883  7/2014
JP  6-232430  8/1994
(Continued)

OTHER PUBLICATIONS

Sheng-Chi Chen et al., "Structural, optical, and electrical properties of NiO-In composite films deposited by radio frequency cosputtering", Journal of Vacuum Science & Technology A, vol. 32, No. 2, 02B118, Feb. 18, 2014.

(Continued)

*Primary Examiner* — Allison Bourke
(74) *Attorney, Agent, or Firm* — Renner, Otto, Boisselle & Sklar, LLP

(57) ABSTRACT

A solar cell module includes a substrate, and first and second cells connected in series. The first and second cells each include a first electrode, a first semiconductor layer, a second semiconductor layer and a second electrode stacked in this order on the substrate. The first semiconductor layer contains an oxide of a first metal and includes first and second portions. A groove separates the second semiconductor layers of the first and second cells. The groove and the first portion entirely overlap each other in a plan view. The first portion contains a second metal different from the first metal. A ratio of a number of atoms of the second metal to a number of atoms of all metals in the first portion is grater than a ratio of a number of atoms of the second metal to a number of atoms of all metals in the second portion.

7 Claims, 17 Drawing Sheets

(56) References Cited

U.S. PATENT DOCUMENTS

| | | | | |
|---|---|---|---|---|
| 2010/0252089 A1* | 10/2010 | Sportel | ............ | H01L 31/03921 136/244 |
| 2011/0037176 A1* | 2/2011 | Straub | ................ | H01L 31/0463 257/773 |
| 2017/0005211 A1* | 1/2017 | Reid | .................... | H01G 9/2081 |

FOREIGN PATENT DOCUMENTS

| | | |
|---|---|---|
| JP | 10-012899 | 1/1998 |
| JP | 2007-109842 | 4/2007 |
| JP | 2012-023257 | 2/2012 |
| JP | 2013-211255 | 10/2013 |
| JP | 2014-160689 | 9/2014 |
| WO | 2013/031978 | 3/2013 |

OTHER PUBLICATIONS

K. Ravichandran et al., "Enhancing the electrical parameters of ZnO films deposited using a low-cost chemical spray technique through Ta doping", Journal of Alloys and Compounds 656(2016), pp. 332-338, Sep. 15, 2015.

Jingzhen Shao et al., "Metal-semiconductor transition in Nb—doped ZnO thin films prepared by pulsed laser deposition", Thin Solid Films 518 (2010) pp. 5288-5291, May 20, 2010.

Sh. El Yamny et al., "Preparation and Characterization of ZnO:In Transparent Conductor by Low Cost Dip Coating Technique", Journal of Modern Physics, 2012, 3, pp. 1060-1069, Jul. 2012.

Seval Aksoy et al., "Effect of Sn dopants on the optical and electrical properties of ZnO films", Optica Applicata, vol. XL, No. 1, pp. 7-14, 2010.

Chien-Yie Tsay et al., "Sol-gel derived undoped and boron-doped ZnO semiconductor thin films: Preparation and characterization", Ceramics International 39, 2013, pp. 7425-7432, Mar. 7, 2013.

Min-Chul Jun et al., "Comparative studies of Al—doped ZnO and Ga—doped ZnO transparent conducting oxide thin films", Nanoscale Research Letters 2012, 7:639, Nov. 22, 2012.

Toshinobu Yoko et al., "Photoelectrochemical properties of Sb—Doped TiO2 film semiconductor electrode prepared by the Sol-Gel method", The chemical society of Japan, 11, pp. 1946-1951, 1987 (English Abstract).

K. Sieradzka et al., "Properties of Nanocrystalline TiO2:V Thin Films as a Transparent Semiconducting Oxides", Acta Physica Polonica A, vol. 116, 2009.

Taro Hitosugi et al., "Ta—doped Anatase TiO2 Epitaxial Film as Transparent Conducting Oxide", Japanese Journal of Applied Physics vol. 44, No. 34, pp. L1063-L1065, Aug. 15, 2015.

Fabio Matteocci et al., "High efficiency photovoltaic module based on mesoscopic organometal halide perovskite", Progress in Photovoltaics: Research and Applications, vol. 24, pp. 436-445, Nov. 6, 2014.

Jong H. Kim et al., "High-Performance and Environmentally Stable Planar Heterojunction Perovskite Solar Cells Based on a Solution-Processed Copper-Doped Nickel Oxide Hole-Transporting Layer", Advanced Materials, vol. 27, pp. 695-701, Nov. 29, 2014.

* cited by examiner

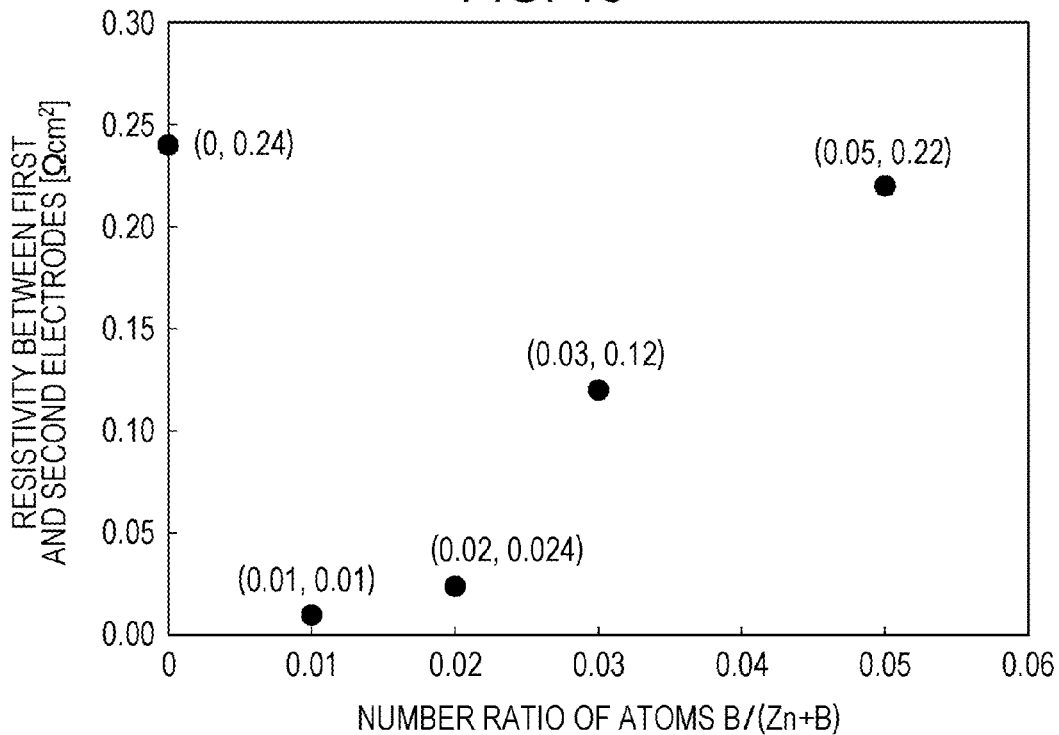
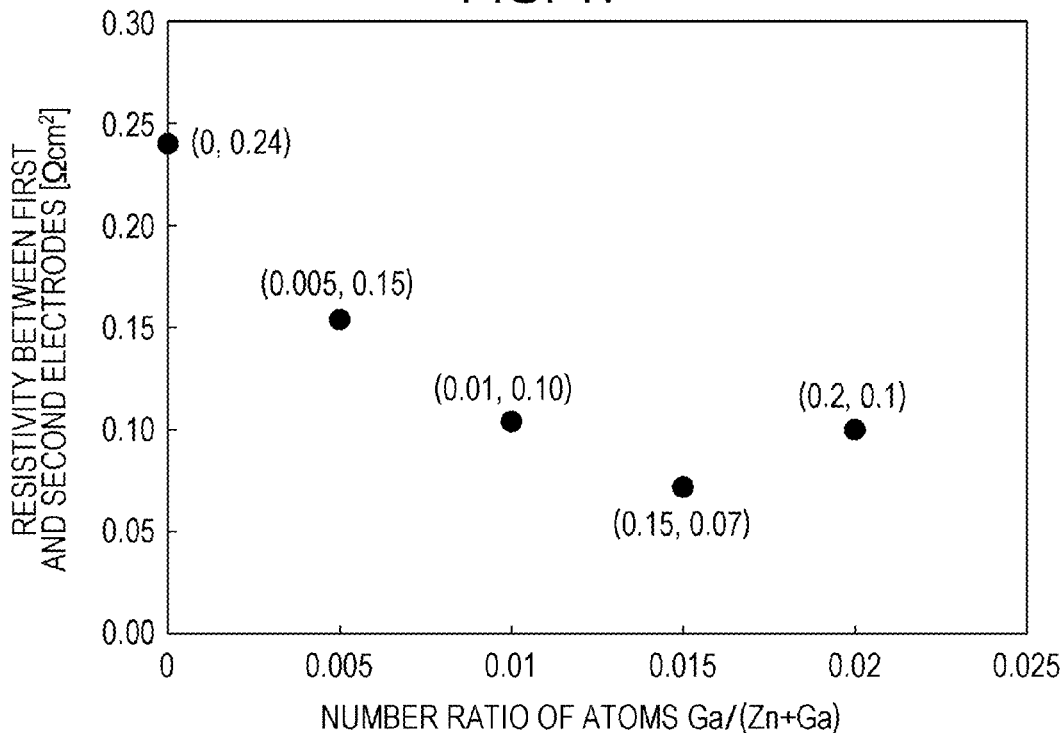

SOLAR CELL MODULE AND METHOD OF PRODUCING THE SAME

BACKGROUND

1. Technical Field

The present disclosure relates to a solar cell module including solar cells connected in series on a substrate.

2. Description of the Related Art

In a thin-film solar cell module including a plurality of unit cells connected in series on a single substrate, the area per unit cell is small compared to that of a single-crystal solar cell module. That is, since the output current per unit cell is small, the thin-film solar cell module can be used at high voltage and low output current. Consequently, it is possible to suppress the ohmic loss.

Such thin-film solar cell modules have been disclosed in, for example, Fabio Matteocci and ten other authors, "PROGRESS IN PHOTOVOLTAICS: RESEARCH AND APPLICATIONS" (USA), April 2016, Vol. 24, pp. 436-445, DOI: 10.1002/pip.2557; Jong H. Kim and seven other authors, "Advanced Materials" (Germany), January 2015, Vol. 27, pp. 695-701, DOI:10.1002/adma.201404189; and International Publication No. 2013/031978.

SUMMARY

Thin-film solar cell modules are required to reduce the resistance between adjacent unit cells and to further suppress the ohmic loss.

One non-limiting and exemplary embodiment provides a solar cell module that can reduce the ohmic loss.

In one general aspect, the techniques disclosed here feature a solar cell module including: a substrate; a first unit cell on the substrate; and a second unit cell on the substrate, the second unit cell being connected to the first unit cell in series. The first unit cell and the second unit cell each include: a first electrode on the substrate; a first semiconductor layer on the first electrode, the first semiconductor layer comprising a first portion and a second portion other than the first portion, the first semiconductor layer containing an oxide of a first metal; a second semiconductor layer on the first semiconductor layer; and a second electrode on the second semiconductor layer. A part of the second electrode of the first unit cell is located in a groove that separates the second semiconductor layer of the first unit cell from the second semiconductor layer of the second unit cell. The groove and the first portion entirely overlap each other in a plan view. The second electrode of the first unit cell is electrically connected to the first electrode of the second unit cell via the first portion of the first semiconductor layer of the second unit cell. The first portion contains a second metal different from the first metal. A first ratio of a number of atoms of the second metal to a number of atoms of all metals in the first portion is grater than a second ratio of a number of atoms of the second metal to a number of atoms of all metals in the second portion.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 16 is a graph showing a relationship between the number ratio B/(Zn+B) of the impurity metal atoms and the resistivity R between the electrodes in a sample of Example 10;

FIG. 17 is a graph showing a relationship between the number ratio Ga/(Zn+Ga) of the impurity metal atoms and the resistivity R between the electrodes in a sample of Example 11;

DETAILED DESCRIPTION

The findings as a basis for the present disclosure are as follows.

Each unit cell of a thin-film solar cell module includes, for example, a first electrode, a semiconductor layer, and a second electrode in this order on a substrate. The semiconductor layer is provided with an opening. The opening is filled with the material of the second electrode to electrically connect the second electrode to the first electrode of an adjacent unit cell. This configuration connects adjacent unit cells in series. However, the first electrode and the second electrode cannot be connected to each other at a low resistance state in some cases. For example, if a part of a semiconductor film remains in the opening, the residue may act as a resistance component. This will now be described with reference to a drawing.

Figure 24:
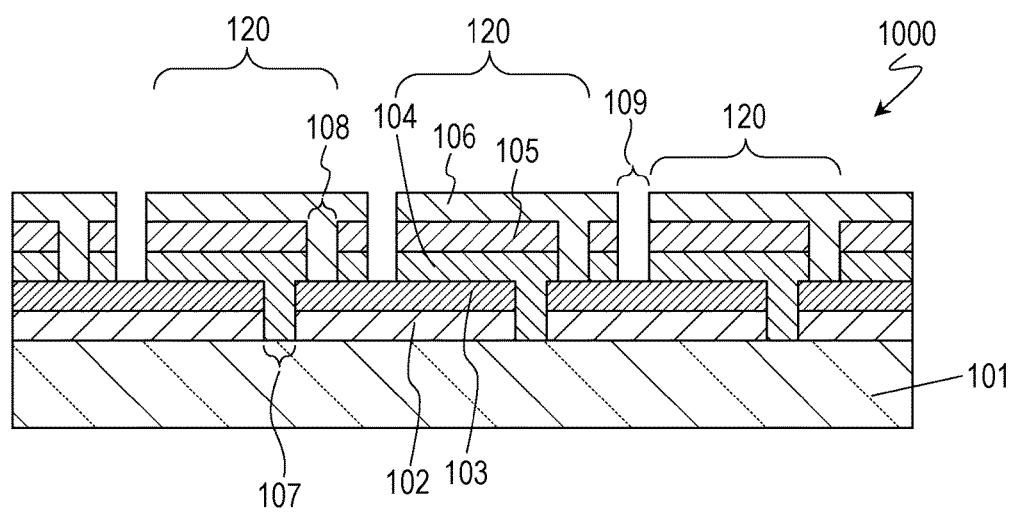
FIG. 24 is a schematic cross-sectional view illustrating a solar cell module of a reference example.

FIG. 24 is a schematic cross-sectional view illustrating an example of the structure of a solar cell module 1000 of a reference example.

The solar cell module 1000 of the reference example includes a substrate 101 and a plurality of unit cells 120 disposed on the substrate 101. Each of the unit cells 120 includes a first electrode layer 102, a second electrode layer 106, and a laminated semiconductor layer disposed therebetween. In this example, the laminated semiconductor layer includes a first semiconductor layer 103, a second semiconductor layer 104, and a third semiconductor layer 105 from the substrate 101 side.

In a plurality of adjacent unit cells 120, the layers constituting the unit cell 120 are divided by a plurality of dividing grooves. Herein, the first electrode layer 102 and the first semiconductor layer 103 on the substrate 101 are divided by first dividing grooves 107. The second semiconductor layer 104 and the third semiconductor layer 105 are divided by second dividing grooves 108. The second semiconductor layer 104, the third semiconductor layer 105, and the second electrode layer 106 are divided by third dividing grooves 109.

The second electrode layer 106 of each unit cell 120 is electrically connected to the first electrode layer 102 of an adjacent unit cell in the second dividing groove 108. Consequently, each unit cell is connected to an adjacent unit cell in series.

The solar cell module 1000 is produced by, for example, repeating a process of forming a film and a process of removing a part of the resulting film to form a dividing groove. In this example, a semiconductor film becoming the second semiconductor layer 104 and a semiconductor film becoming the third semiconductor layer 105 are deposited on a substrate 101 provided with patterned first electrode layer 102 and first semiconductor layer 103, and second dividing grooves 108 are then formed. Consequently, a plurality of second semiconductor layers 104 and a plurality of third semiconductor layers 105 are formed from these semiconductor films. On this occasion, it is desirable that the first semiconductor layer 103 be also completely removed in the second dividing groove 108. However, as shown in FIG. 24, in the second dividing groove 108, the first semiconductor layer 103 may remain on the surface of the first electrode layer 102. In such a case, the first electrode layer 102 and the second electrode layer 106 are connected via the first semiconductor layer 103. As a result, the resistance between the electrodes increases, which causes ohmic loss. Throughout the specification, a dividing groove for connecting adjacent unit cells may be referred to as "cell-connecting groove". Herein, the second dividing groove 108 is a cell-connecting groove.

The above-mentioned problems are also described in, for example, Fabio Matteocci and ten other authors, "PROGRESS IN PHOTOVOLTAICS: RESEARCH AND APPLICATIONS" (USA), April 2016, Vol. 24, pp. 436-445, DOI: 10.1002/pip.2557 (Non Patent Literature 1) and International Publication No. 2013/031978 (Patent Literature 1). For example, in Patent Literature 1, a cell-connecting groove is formed in the photoelectric conversion layer by a laser scribing method. On this occasion, the overcoat layer (semiconductor film) partially remains in the cell-connecting groove in some cases. Patent Literature 1 describes a problem that this overcoat layer is thermally denatured by the laser scribing to increase the value of resistance, resulting in an increase in the power loss of the solar cell module.

Against this problem, Non Patent Literature 1 and Patent Literature 1 each propose a method of forming a cell-connecting groove in such a manner that the semiconductor film does not remain on the bottom.

The present inventor studied on configurations capable of reducing the resistance between electrodes without removing the semiconductor film in the cell-connecting groove, unlike in the above-mentioned documents. As a result, it was found that unit cells can be connected to each other with a low resistance by reducing the resistance of the portion of the semiconductor film located on the bottom of the cell-connecting groove to be lower than that of the other portion.

Embodiments of the present disclosure are summarized as follows:

[Item 1] A solar cell module comprising:
a substrate;
a first unit cell on the substrate; and
a second unit cell on the substrate, the second unit cell being connected to the first unit cell in series, wherein
the first unit cell and the second unit cell each include:
a first electrode on the substrate;
a first semiconductor layer on the first electrode, the first semiconductor layer comprising a first portion and a second portion other than the first portion, the first semiconductor layer containing an oxide of a first metal and;
a second semiconductor layer on the first semiconductor layer; and
a second electrode on the second semiconductor layer,
a part of the second electrode of the first unit cell is located in a groove that separates the second semiconductor layer of the first unit cell from the second semiconductor layer of the second unit cell, the groove and the first portion entirely overlapping each other in a plan view,
the second electrode of the first unit cell is electrically connected to the first electrode of the second unit cell via the first portion of the first semiconductor layer of the second unit cell,
the first portion contains a second metal different from the first metal, and
a first ratio of a number of atoms of the second metal to a number of atoms of all metals in the first portion is grater than a second ratio of a number of atoms of the second metal to a number of atoms of all metals in the second portion;

[Item 2] The solar cell module according to Item 1, wherein the first electrode contains the second metal;

[Item 3] The solar cell module according to Item 2, wherein the first electrode contains an oxide of the second metal;

[Item 4] The solar cell module according to Item 1, wherein the first ratio is 0.9% or more and the second ratio is less than 0.5%;

[Item 5] The solar cell module according to Item 1, wherein the first metal is titanium;

[Item 6] The solar cell module according to Item 1, wherein the second metal is tin;

[Item 7] The solar cell module according to Item 1, wherein the second semiconductor layer comprises a plurality of semiconductor layers;

[Item 8] A method of producing a solar cell module, comprising:
(a) forming a first electrode film on a substrate;
(b) forming a first semiconductor film on the first electrode film, the first semiconductor film containing an oxide of a first metal;
(c) forming a first groove dividing the first electrode film and dividing the first semiconductor film;
(d) forming a second semiconductor film on the first semiconductor film;
(e) forming a second groove dividing the second semiconductor film;
(f) irradiating a first portion of the first semiconductor film with laser light to heat the first portion and to allow a second metal different from the first metal to diffuse in the first portion, the first portion and the second groove entirely overlapping each other in a plan view;
(g) forming a second electrode film on the second semiconductor film and in the second groove; and
(h) forming a third groove dividing the second electrode film;

[Item 9] The method of producing a solar cell module according to Item 8, wherein the laser light is third harmonic light of an yttrium-aluminum-garnet (YAG) laser in the (f); and

[Item 10] The method of producing a solar cell module according to Item 8, further comprising
(i) supplying the second metal onto the first portion, wherein
the (i) is performed after the (a) and before the (f).

[Item 11] The method of producing a solar cell module according to Item 8, wherein the second semiconductor film comprises a plurality of semiconductor films in the (d).

EMBODIMENTS

A solar cell module of an embodiment of the present disclosure will now be described with reference to the drawings. It should be understood that the solar cell module of the present disclosure is not limited to the following embodiments. In the following descriptions, specific numerical values or specific materials may be shown as examples, and other numerical values or other materials may be applied.

Figure 1:
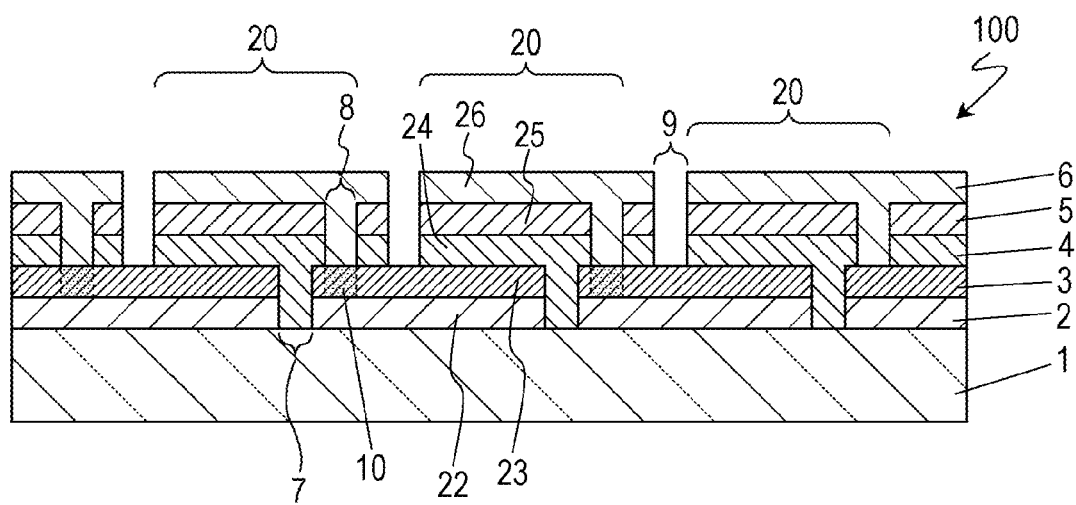
FIG. 1 is a schematic cross-sectional view illustrating a solar cell module of an embodiment of the present disclosure.

FIG. 1 is a schematic cross-sectional view illustrating an example of the solar cell module of an embodiment of the present disclosure.

The solar cell module 100 is an integrated solar cell including a plurality of unit cells 20 connected to one another in series. The solar cell module 100 includes a substrate 1 and a first electrode film 2, a first semiconductor film 3, a second semiconductor film 4, a third semiconductor film 5, and a second electrode film 6 stacked in this order on the substrate 1. The first semiconductor film 3, the second semiconductor film 4, and the third semiconductor film 5 form a junction generating photovoltaic power. Examples of the materials of these films are described below.

The first electrode film 2 is divided into a plurality of first electrode layers 22 by first dividing grooves 7. The first semiconductor film 3 is also divided into a plurality of first semiconductor layers 23 by the first dividing grooves 7. The second semiconductor film 4 is divided into a plurality of second semiconductor layers 24 by second dividing grooves 8. The third semiconductor film 5 is divided into a plurality of third semiconductor layers 25 by the second dividing grooves 8. The second electrode film 6 is divided into a plurality of second electrode layers 26 by third dividing grooves 9. The third dividing grooves 9 may also be formed in the second semiconductor film 4 and the third semiconductor film 5. The first dividing grooves 7, the second dividing grooves 8, and the third dividing grooves 9 may extend, for example, in a stripe form. These grooves may be formed in substantially parallel to each other.

The plurality of unit cells 20 each have a layered structure including a first electrode layer 22, a first semiconductor layer 23 disposed on the first electrode layer 22, a second semiconductor layer 24 and a third semiconductor layer 25 stacked on the first semiconductor layer 23, and a second electrode layer 26 disposed on the third semiconductor layer 25. The second dividing groove 8 is formed such that the first electrode layer 22 and the first semiconductor layer 23 overlap with each other when viewed from the normal direction of the substrate 1. In the second dividing groove 8, the second electrode layer 26 of an adjacent unit cell is disposed. The first electrode layer 22 is electrically connected to the second electrode layer 26 of the adjacent unit cell in the second dividing groove 8. That is, the second dividing groove 8 functions as a cell-connecting groove.

Thus, each unit cell 20 is an independent solar cell including a first semiconductor layer 23, a second semiconductor layer 24, and a third semiconductor layer 25 forming a junction and a first electrode layer 22 and a second electrode layer 26 serving as output terminals. The first electrode layer 22 of one unit cell 20 is electrically connected to the second electrode layer 26 of one of the adjacent unit cells on both sides of the unit cell 20. The second electrode layer 26 of the unit cell 20 is electrically connected to the first electrode layer 22 of the other of the adjacent unit cells. Thus, a plurality of unit cells 20 are connected in series.

The first semiconductor layer 23 in the embodiment contains a metal (hereinafter, referred to as "first metal") contained in the main component of the first semiconductor layer 23 and an impurity metal (hereinafter, referred to as "second metal") other than the first metal. The number ratio A of the second metal atoms to the total of all metal atoms in the portion 10 of the first semiconductor layer 23 facing the second dividing groove 8 is grater than the number ratio B of the second metal atoms to the total of all metal atoms in the portion of the first semiconductor layer 23 not facing the second dividing groove 8. In other words, the ratio A of the number of atoms of the second metal to the total number of atoms of all metals in the portion 10 of the first semiconductor layer 23 facing the second dividing groove 8 is grater than the ratio B of the number of atoms of the second metal to the number of atoms of all metals in the portion of the first semiconductor layer 23 not facing the second dividing groove 8. Throughout the specification, the portion 10 of the first semiconductor layer 23 facing the second dividing groove 8 is referred to as "first semiconductor junction". In this example, the portion located on the bottom of the second dividing groove 8 and interposed between the first electrode layer 22 and the second electrode layer 26 is the first semiconductor junction. That is, the portion of the first semiconductor layer 23 overlapping with the second dividing groove 8 in a plan view is referred to as "first semiconductor junction".

In this embodiment, the first semiconductor junction 10 of the first semiconductor layer 23 contains a second metal at a higher concentration than the other portion, resulting in a reduction in the resistance. Consequently, the resistance between the first electrode layer 22 and the second electrode layer 26 in the second dividing groove 8 can be reduced compared to that of, for example, the solar cell module 1000 of the reference example described above. Thus, since unit cells can be connected to each other so as to give a lower resistance, the ohmic loss inside the solar cell module 100 is reduced to realize higher output than before.

The first semiconductor junction 10 has a lower resistance than that of the other portion due to contamination with an impurity metal. Accordingly, an effect of reducing the resistance between unit cells can be obtained regardless of the shape. For example, the first semiconductor junction 10 may have a thickness smaller than that of the other portion of the first semiconductor layer 23. For example, in the process of etching the second semiconductor film 4 and the third semiconductor film 5, a part of the first semiconductor film 3 is also removed. As a result, the portion of the first semiconductor film 3 located on the bottom of the second dividing groove 8 may have a reduced thickness. The first semiconductor junction 10 needs not have a film-like shape and needs not cover the whole upper surface of the first electrode layer 22 by partial chipping. That is, the first semiconductor junction 10 needs not be present on the whole bottom of the second dividing groove 8.

According to this embodiment, unit cells can be connected to each other with a low resistance without removing the first semiconductor film 3 when the second dividing groove 8 is formed. Accordingly, the freedom of selection of the material for the first semiconductor film 3 and the freedom of selection of the method of etching the second semiconductor film 4 and the third semiconductor film 5 are high. For example, as the material for the first semiconductor film 3, metal oxides, such as $TiO_2$, ZnO, and NiO, which are hardly removed by etching or another method, can also be used. For example, Jong H. Kim and seven other authors, "Advanced Materials" (Germany), January 2015, Vol. 27, pp. 695-701, DOI:10.1002/adma.201404189 discloses that a NiO film required to have both high transparency and high electrical conduction property is formed as a rigid film by a vacuum process, such as sputtering. Such a film is probably difficult to be completely removed from a groove by, for example, etching. In contrast, the embodiment can be suitably applied also to a case of using a film that is difficult to be removed by, for example, etching as the first semiconductor film 3.

The function of each component will now be described.

Substrate 1

The substrate 1 has an insulating surface at least on the side in contact with the first electrode film 2. In a case where the solar cell module absorbs light incident from the substrate 1 side to generate power, the substrate 1 may have optical transparency. As the material of the substrate 1, for example, a transparent insulating material is used. Examples of such a material include glass, alumina, acrylic, and PET.

Semiconductor Film

The second semiconductor film 4 is, for example, a photoelectric conversion layer performing photoelectric conversion. One of the first semiconductor film 3 and the third semiconductor film 5 may be, for example, an electron transport layer, and the other may be a hole transport layer. The electron transport layer has a property of transmitting only the electrons of electron-hole pairs generated in the second semiconductor film 4. The hole transport layer has a property of transmitting only the holes of electron-hole pairs generated in the second semiconductor film 4.

The combination of the first semiconductor film 3, the second semiconductor film 4, and the third semiconductor film 5 forms a junction. For example, in a case where the first semiconductor film 3 is an n-type semiconductor, the second semiconductor film 4 is an intrinsic semiconductor, and the third semiconductor film 5 is a p-type semiconductor, the layered structure composed of the first semiconductor film 3, the second semiconductor film 4, and the third semiconductor film 5 forms an n-i-p structure. Examples of forming an n-i-p structure include a case where the second semiconductor film 4 is a photoelectric conversion layer, the first semiconductor film 3 is an electron transport layer, and the third semiconductor film 5 is a hole transport layer. Examples of the combination of these semiconductor layers include a case where the first semiconductor film 3 is made of $TiO_2$, the second semiconductor film 4 is made of a photoelectric conversion material containing a perovskite compound, and the third semiconductor film 5 is made of 2,2',7,7'-tetrakis(N,N'-di-p-methoxyphenylamine)-9-9'-spirobifluorene (Spiro-OMeTAD). Examples of the photoelectric conversion material containing a perovskite compound include $CH_3NH_3PbI_3$.

These semiconductor films may form a p-i-n structure. For example, a p-i-n structure is formed when the second semiconductor film 4 is a photoelectric conversion layer, the first semiconductor film 3 is a hole transport layer, and the third semiconductor film 5 is an electron transport layer. Examples of the layered product forming a p-i-n structure include the case where the first semiconductor film 3, the second semiconductor film 4, and the third semiconductor film 5 are NiO, an organic-inorganic hybrid perovskite material, and [6,6]-phenyl $C_{61}$ butyric acid methyl ester (PCBM), respectively.

The thicknesses of the semiconductor films may be different from one another depending on the materials of the semiconductor films. For example, the thicknesses of the first semiconductor film 3 and the third semiconductor film 5 are each determined such that the resistance of the film itself can be reduced and that pinholes are not generated. For example, in a case where the first semiconductor film 3 or the third semiconductor film 5 is a $TiO_2$ film, a ZnO film, or a NiO film, the thickness may be, for example, 10 nm or more and 100 nm or less. In a case where the first semiconductor film 3 or the third semiconductor film 5 is mainly composed of a hole transport material, such as Spiro-OMeTAD and PCBM, the thickness may be, for example, 0.1 μm or more and 0.4 μm or less. In a case where the first semiconductor film 3 or the third semiconductor film 5 is a Nb-doped $TiO_2$ film, the thickness is, for example, 0.1 μm or more and 0.4 μm or less; in a case of a C film, the thickness is, for example, 0.2 μm or more and 1 μm or less; in a case of an amorphous Si:H film, the thickness is, for example, 0.1 μm or more and 0.5 μm or less; and in a case of an amorphous Si:P film, the thickness is, for example, 10 nm or more and 100 nm or less.

In addition, the thickness of the second semiconductor film 4 is determined so as to sufficiently absorb light and to sufficiently perform charge separation. The suitable thickness range of the second semiconductor film 4 varies depending on the main component contained in the second semiconductor film 4. For example, in a case where the second semiconductor film 4 is mainly composed of an organic-inorganic hybrid perovskite represented by $CH_3NH_3PbI_3$, the thickness may be, for example, 0.3 μm or more and 0.8 μm or less. In a case where the second semiconductor film 4 is a CdTe film, the thickness may be, for example, 1 μm or more and 5 μm or less. In a case where the second semiconductor film 4 is an amorphous SiC:H film, the thickness may be, for example, 0.01 μm or more and 0.1 μm or less.

First Electrode Film 2 and Second Electrode Film 6

The first electrode film 2 and the second electrode film 6 have conductive properties. As the first electrode film 2, an electrode film that can form an ohmic contact with the first semiconductor film 3 can be used. As the second electrode film 6, an electrode film that can form an ohmic contact with the third semiconductor film 5 can be used. At least one of the first electrode film 2 and the second electrode film 6 has optical transparency. For example, in a case where the light incident from the substrate 1 is absorbed to generate power, at least the first electrode film has optical transparency. In other cases, at least the second electrode film has optical transparency.

The material that can be used as an electrode film varies depending on whether the semiconductor film in contact with the electrode film is an n-type or a p-type. As the electrode film in contact with an n-type semiconductor film, a metal oxide film that can form an ohmic contact with the n-type semiconductor film can be used. Examples of such metal oxides include tin oxide, aluminum-doped zinc oxide, boron-doped zinc oxide, gallium-doped zinc oxide, Nb-doped titanium oxide, tantalum-doped titanium oxide, fluorine-doped tin oxide, antimony-doped tin oxide, indium oxide, indium tin oxide, and niobium-doped titanium oxide. As the electrode film in contact with a p-type semiconductor film, a metal oxide film that can form an ohmic contact with the p-type semiconductor film can be used. Examples of such metal oxides include nickel oxide, copper aluminum oxide, copper(I) oxide, copper(II) oxide, and molybdenum oxide.

The thicknesses of the first electrode film 2 and the second electrode film 6 are each adjusted based on the finally required value of sheet resistance and light transmittance and are each, for example, 0.2 μm or more and 1 μm or less.

First Dividing Groove 7

The first dividing grooves 7 divide each of the first electrode film 2 and the first semiconductor film 3 into a plurality of portions (first electrode layers 22 and first semiconductor layers 23) electrically insulated from one another. The first dividing grooves 7 are each formed by removing a part of the first electrode film 2 and a part of the first semiconductor film 3. The first dividing grooves 7 can be formed by scribing with light having a wavelength that is absorbed by the first electrode film 2. For example, the first electrode film 2 may be irradiated with a YAG laser (wavelength: 1065 nm) to form the first dividing grooves 7.

The first dividing grooves 7 may each have a width of, for example, 10 μm or more and 100 μm or less.

Second Dividing Groove 8

The second dividing grooves 8 divide each of the second semiconductor film 4 and the third semiconductor film 5 into a plurality of portions (second semiconductor layers 24 and third semiconductor layers 25) electrically insulated from one another. The second dividing grooves 8 are each formed by removing a part of the second semiconductor film 4 and a part of the third semiconductor film 5. At the bottom of each of the second dividing grooves 8, the first semiconductor film 3 is exposed. In each of the second dividing grooves 8, the first semiconductor film 3 and the second electrode film 6 are in direct contact with each other to be electrically connected.

The second dividing grooves 8 each have a width of, for example, 50 μm or more and 200 μm or less.

The second dividing grooves 8 are formed by, for example, laser scribing involving irradiation with concentrated laser light or mechanical scribing involving scraping with a hardened metal blade. As an example, the second semiconductor film 4 and the third semiconductor film 5 that absorb light of longer wavelengths may be removed by mechanical scribing, and the first semiconductor film 3 may be then doped with an impurity by laser scribing.

Third Dividing Groove 9

The third dividing grooves 9 divide the second electrode film 6 into a plurality of portions (second electrode layers 26) electrically insulated from one another. The third dividing grooves 9 may be each formed by removing a part of the second semiconductor film 4, a part of the third semiconductor film 5, and a part of the second electrode film 6. The third dividing grooves 9 need not divide the second semiconductor film 4 and/or the third semiconductor film 5 as long as the second electrode film 6 is divided. The third dividing grooves 9 can be formed by the same procedure as for the first dividing grooves or the second dividing grooves.

The third dividing grooves 9 each have a width of, for example, 20 µm or more and 100 µm or less.

First Semiconductor Junction 10

The first semiconductor junctions 10 each have a reduced resistance by containing an impurity metal at a higher concentration than the other portion of the first semiconductor layer 23 not facing the second dividing groove 8, resulting in suppression of the ohmic loss occurring between the second electrode layer 26 and the first electrode layer 22 existing respectively on and under each junction 10.

The impurity metal contained in the first semiconductor junctions 10 may be derived from another component constituting the solar cell module 100, i.e., the first electrode film 2, the second semiconductor film 4, the third semiconductor film 5, or the second electrode film 6. The impurity metal may be diffused from the first electrode film 2 to the first semiconductor film 3. For example, the impurity metal may be the same as the metal contained in the main component of the first electrode film 2, for example, the metal contained most in the first electrode film 2. Diffusion of a part of the metal atoms bearing the electrical conduction in the first electrode film 2 to the first semiconductor film 3 constitutes an electrical conduction path in the crystal grain boundary of the first semiconductor film 3, resulting in a reduction in the resistance of the first semiconductor film 3.

A method for containing the metal atoms of the first electrode film 2 in only a part of the first semiconductor layer 23 or the first semiconductor film 3 is as follows. For example, the portion of the first semiconductor layer 23 exposed by the second dividing groove 8 is irradiated with light having a wavelength that is selectively absorbed by the first semiconductor film to heat the portion. In an example, the first electrode layer 22 is a fluorine-doped tin oxide layer, the first semiconductor layer 23 is a titanium oxide layer. If the first semiconductor layer 23 of titanium oxide having an absorption edge wavelength of 370 nm is irradiated with third harmonic light having a wavelength of 355 nm of a YAG laser, the irradiated portion of the first semiconductor layer 23 is efficiently heated, and the first electrode layer 22 located beneath and in contact with the first semiconductor layer 23 is also heated by heat transfer. On this occasion, a part of tin atoms of the first electrode layer 22 diffuses inside the first semiconductor layer 23 to partially reduce the resistance of the first semiconductor layer 23.

The impurity metal atoms may be added to the first semiconductor junctions 10 from the outside, instead of from the component of the solar cell module. For example, metal atoms imparting a conductive property to the material constituting the first semiconductor film 3 may be added from the outside by, for example, sputtering, deposition, or application. The added metal atoms constitute an electrical conduction path in the crystal grain boundary of the first semiconductor film 3 as in the case where the impurity metal atoms are added from a component of the solar cell module. As a result, the resistance of the first semiconductor film 3 can be reduced.

Metal atoms can be added to the first semiconductor film 3 from the outside by, for example, the following method. A solution containing a predetermined metal as the second metal is applied onto the first semiconductor film 3 or the first semiconductor layers 23 by ink jetting. Subsequently, as in above, the portion of each of the first semiconductor layers 23 facing the corresponding second dividing groove 8 is irradiated with third harmonic light of a YAG laser and is thereby heated. Thus, the second metal may be diffused selectively in the portion of the first semiconductor layer 23 becoming the first semiconductor junction 10.

The method for adding metal atoms to the first semiconductor film 3 from the outside is not limited to the above. For example, the portion of the first semiconductor layer 23 exposed by the second dividing groove 8 may be doped with metal atoms by sputtering.

The first semiconductor junction 10 of the first semiconductor film 3 may contain both a metal atom derived from another component, such as the first electrode film 2, of the solar cell module and a metal atom added to the first semiconductor film 3 from the outside, as the impurity metal atoms.

The degree of the reduction in the value of resistance between the electrodes by providing the first semiconductor junction 10 containing impurity metal atoms varies depending on, for example, the combination of the material of the first semiconductor film 3 and the impurity metal atoms and the concentration of the impurity metal atoms contained in the first semiconductor film 3. The desired combination and the desired concentration of the impurity metal atoms are described below.

Relationship Between Atomic Number Ratio of First Semiconductor Junction 10 and Value of Resistance Between Electrodes The present inventor studied on the relationship between the number ratio of impurity metal atoms in the first semiconductor junction 10 of the first semiconductor film 3 and the value of resistance between the electrodes, using samples for evaluation. The method and the results will now be described.

Examples 1 to 3

As Examples 1 to 3, samples for evaluation having different number ratios of impurity metal atoms in the first semiconductor junction 10 were produced.

Figure 2:
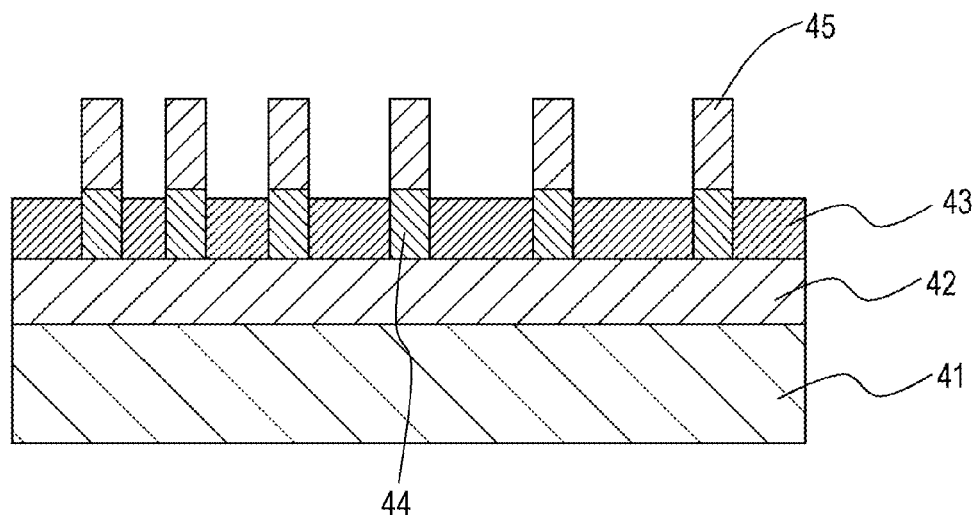
FIG. 2 is a schematic cross-sectional view illustrating the structure of each sample of Examples 1 to 19.

FIG. 2 is a schematic cross-sectional view of the samples of Examples 1 to 3. Each sample includes a substrate 41, a first electrode 42 disposed on the substrate 41, a first semiconductor film 43 disposed on the first electrode 42, and a plurality of second electrodes 45. The first semiconductor film 43 includes a plurality of first semiconductor junctions 44. The plurality of second electrodes 45 are respectively disposed on the corresponding first semiconductor junctions 44.

The sample of Example 1 was produced as follows. A 40-mm-square glass substrate having a thickness of 0.5 mm was used as the substrate 41. On the substrate 41, a fluorine-doped tin oxide layer was disposed as the first electrode 42. A titanium oxide film having a thickness of 30 nm was formed as the first semiconductor film 43 on the first electrode 42 by sputtering.

Figure 3:
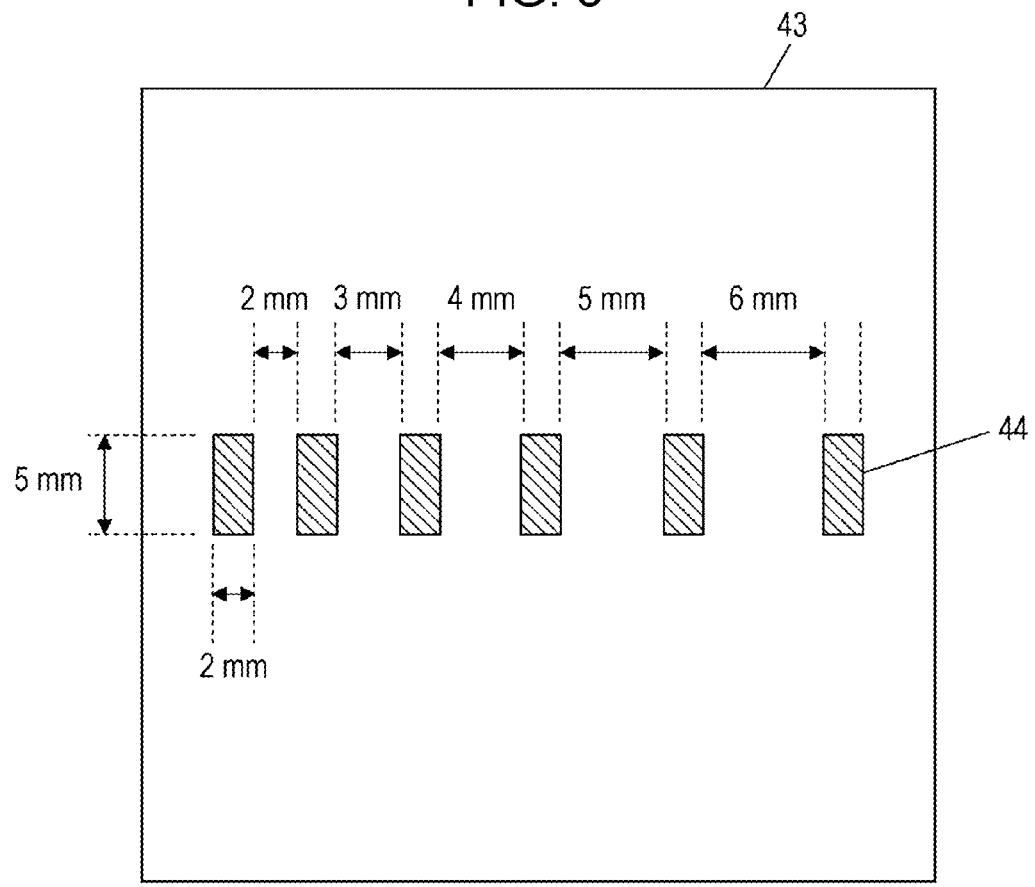
FIG. 3 is a plan view illustrating the first semiconductor film 43 of each sample of Examples 1 to 19.

Subsequently, a part of the first semiconductor film 43 was irradiated with laser light. FIG. 3 is a plan view of the first semiconductor film 43. Herein, as shown in FIG. 3, seven 2-mm by 5-mm rectangular portions of the first semiconductor film 43 were irradiated with third harmonic light of a YAG laser to form first semiconductor junctions 44. These seven first semiconductor junctions 44 were arranged in parallel to one another with spaces therebetween. As shown in FIG. 3, the spaces between the adjacent first semiconductor junctions 44 were 2, 3, 4, 5, and 6 mm from the left. The irradiation with third harmonic light of a YAG laser was performed under the conditions of a repetition frequency of 300 kHz, a substrate moving speed of 1000 mm/sec during irradiation, an irradiation time of 50 ps, an irradiation spot diameter of 36 μm, and an irradiation light power of 0.1 W.

A plurality of second electrodes 45 were then formed on the corresponding first semiconductor junctions 44 using a metal mask. Herein, Au electrodes each having a thickness of 200 nm were formed as the second electrodes 45. Each Au electrode was a rectangle of 2 mm×5 mm in a plan view.

Samples of Examples 2 and 3 were produced as in the sample of Example 1 except that the irradiation light power in the YAG laser irradiation was 0.2 W in Example 2 and 0.5 W in Example 3.

Comparative Examples 1 and 2

A sample of Comparative Example 1 was produced as in Example 1 except that the irradiation with third harmonic light of a YAG laser was not performed.

A sample of Comparative Example 2 was produced as in Example 1 except that the first semiconductor film was not formed and that the irradiation with third harmonic light of a YAG laser was not performed. The sample of Comparative Example 2 corresponds to a case where the resistance of the semiconductor film is zero.

Three samples were produced for each of Examples and Comparative Examples. One of three samples was used for observation and analysis of a cross-section described below, and the remaining two samples were used for measurement of resistivity R described below.

Electron Microscopic Observation and Analysis of First Semiconductor Film

A cross-section of each of the samples of Examples 1 to 3 was observed with a transmission electron microscope (TEM).

Figure 4A:
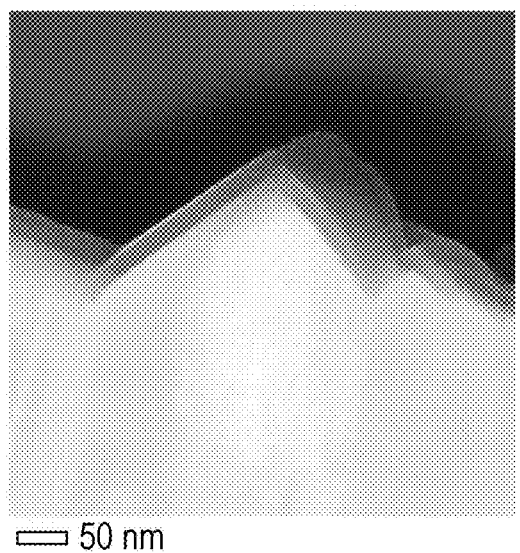
FIG. 4A is a cross-sectional TEM image of a sample of Example 1.
Figure 4B:
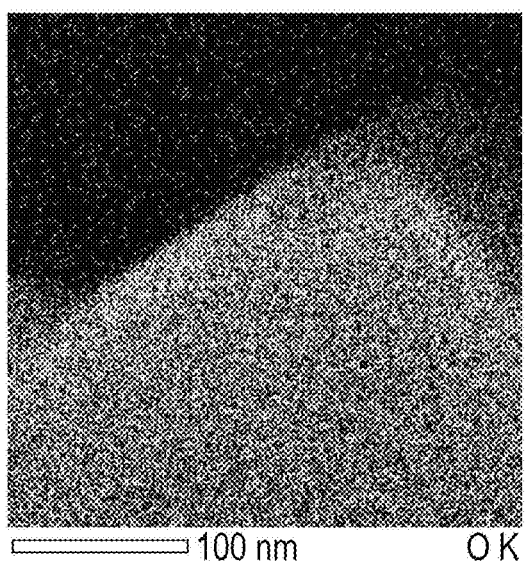
FIG. 4B is an oxygen mapping image of the sample of Example 1 by energy dispersive electron beam-excited X-ray spectrometry.
Figure 4C:
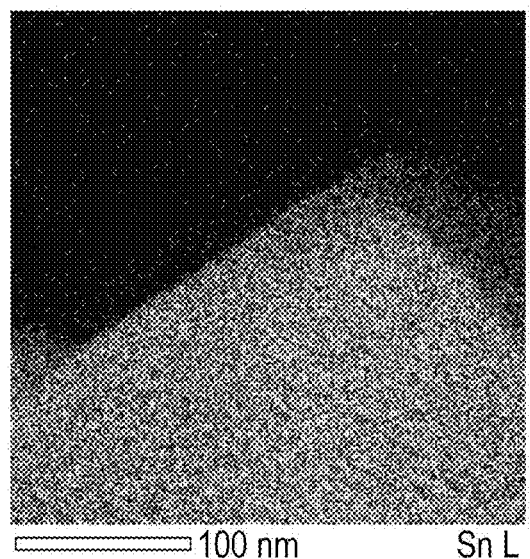
FIG. 4C is a tin mapping image of the sample of Example 1 by energy dispersive electron beam-excited X-ray spectrometry.
Figure 4D:
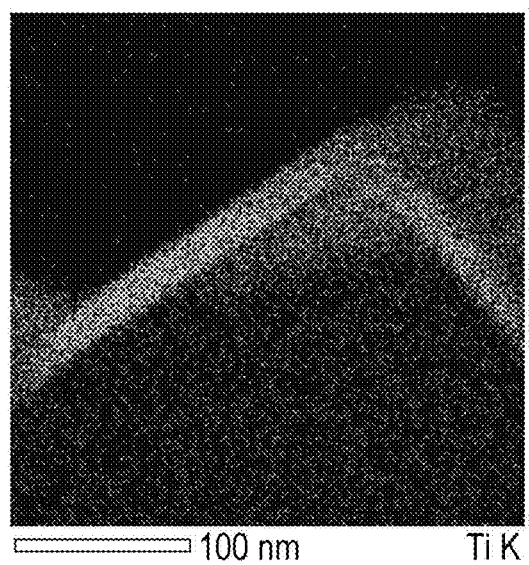
FIG. 4D is a titanium mapping image of the sample of Example 1 by energy dispersive electron beam-excited X-ray spectrometry.
Figure 5A:
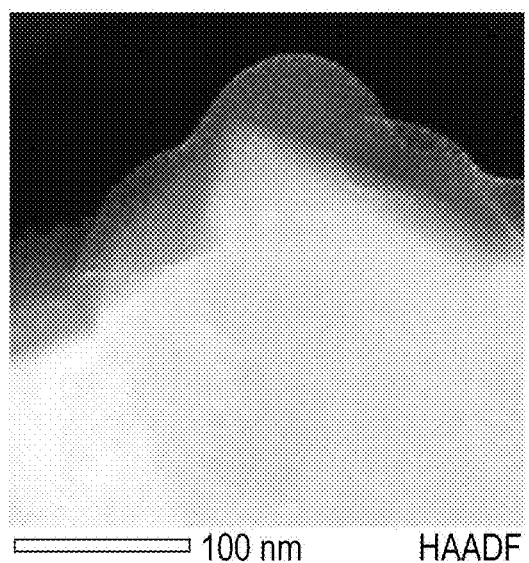
FIG. 5A is a cross-sectional TEM image of a sample of Example 2.
Figure 5B:
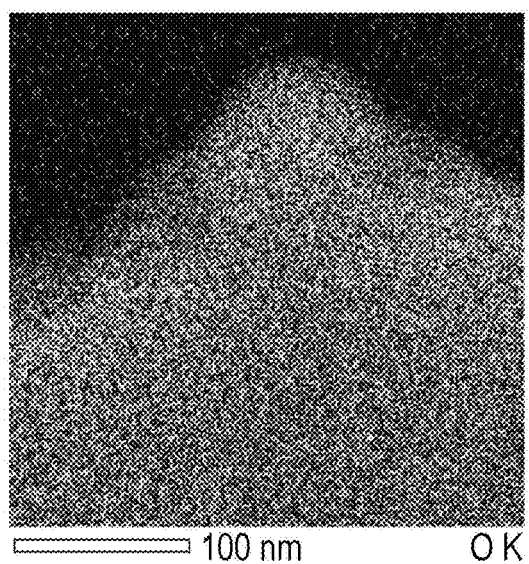
FIG. 5B is an oxygen mapping image of the sample of Example 2 by energy dispersive electron beam-excited X-ray spectrometry.
Figure 5C:
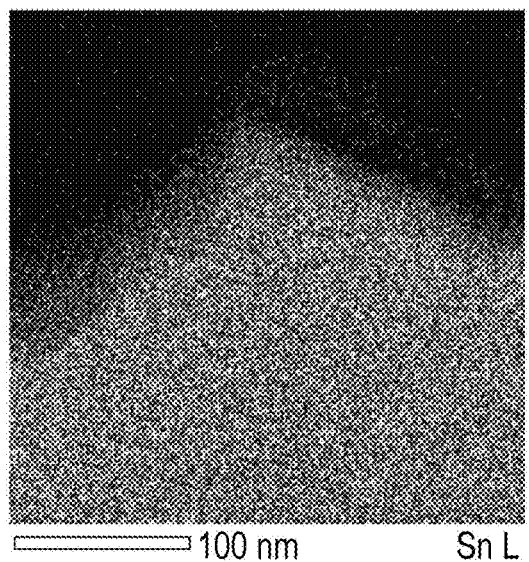
FIG. 5C is a tin mapping image of the sample of Example 2 by energy dispersive electron beam-excited X-ray spectrometry.
Figure 5D:
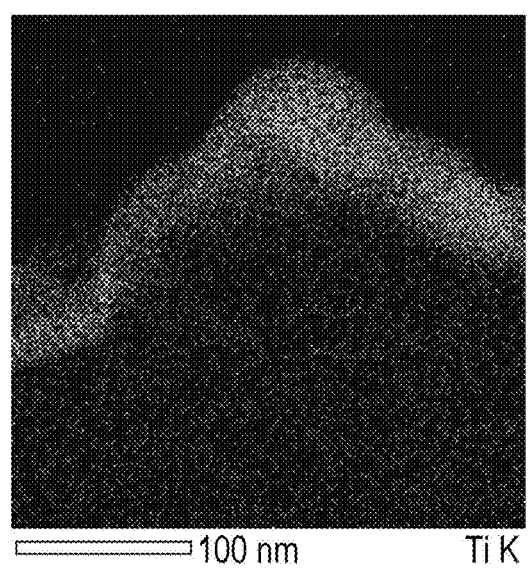
FIG. 5D is a titanium mapping image of the sample of Example 2 by energy dispersive electron beam-excited X-ray spectrometry.
Figure 6A:
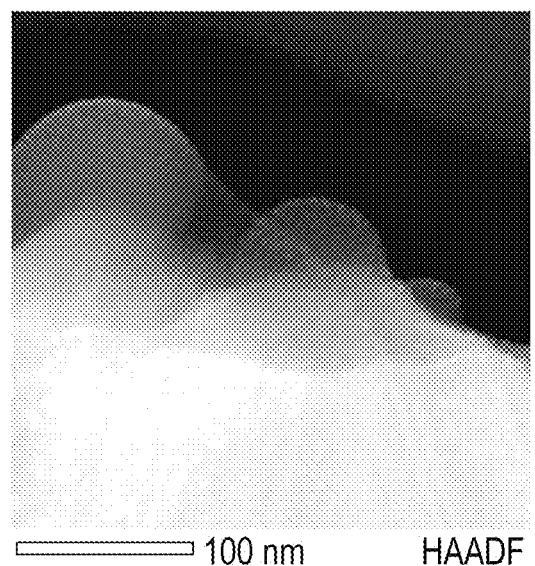
FIG. 6A is a cross-sectional TEM image of a sample of Example 3.
Figure 6B:
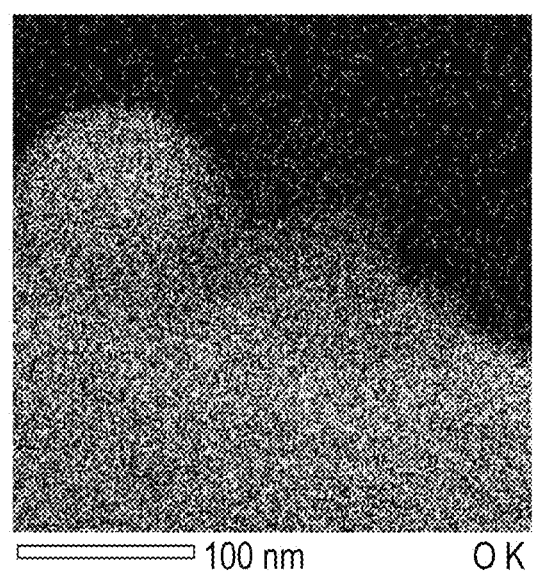
FIG. 6B is an oxygen mapping image of the sample of Example 3 by energy dispersive electron beam-excited X-ray spectrometry.
Figure 6C:
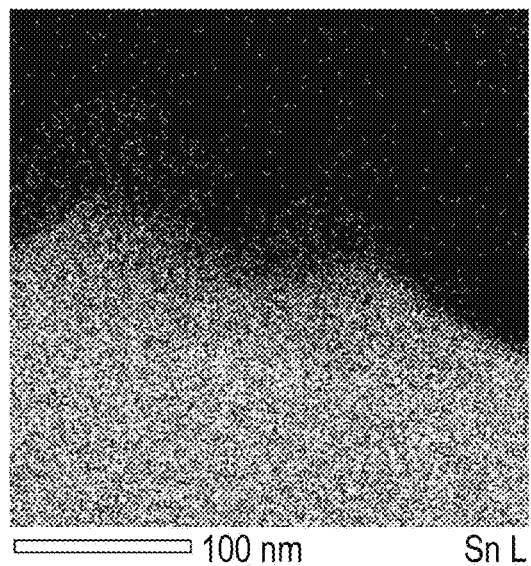
FIG. 6C is a tin mapping image of the sample of Example 3 by energy dispersive electron beam-excited X-ray spectrometry.
Figure 6D:
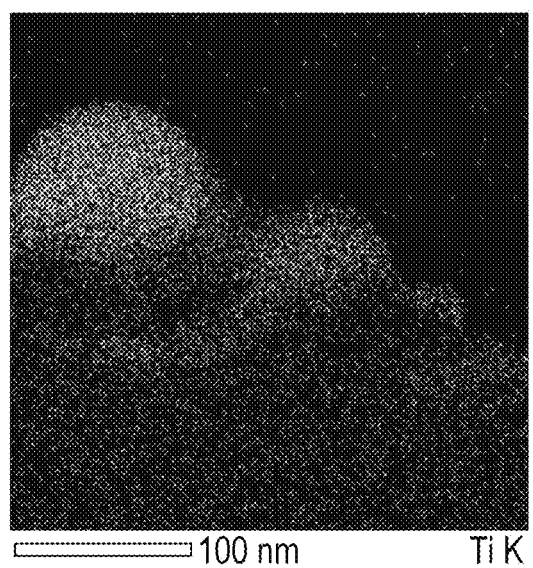
FIG. 6D is a titanium mapping image of the sample of Example 3 by energy dispersive electron beam-excited X-ray spectrometry.

FIG. 4A is a cross-sectional TEM image of a sample of Example 1. FIG. 4B is an oxygen mapping image of the sample of Example 1 by energy dispersive electron beam-excited X-ray spectrometry. FIG. 4C is a tin mapping image of the sample of Example 1 by energy dispersive electron beam-excited X-ray spectrometry. FIG. 4D is a titanium mapping image of the sample of Example 1 by energy dispersive electron beam-excited X-ray spectrometry. FIG. 5A is a cross-sectional TEM image of a sample of Example 2. FIG. 5B is an oxygen mapping image of the sample of Example 2 by energy dispersive electron beam-excited X-ray spectrometry. FIG. 5C is a tin mapping image of the sample of Example 2 by energy dispersive electron beam-excited X-ray spectrometry. FIG. 5D is a titanium mapping image of the sample of Example 2 by energy dispersive electron beam-excited X-ray spectrometry. FIG. 6A is a cross-sectional TEM image of a sample of Example 3. FIG. 6B is an oxygen mapping image of the sample of Example 3 by energy dispersive electron beam-excited X-ray spectrometry. FIG. 6C is a tin mapping image of the sample of Example 3 by energy dispersive electron beam-excited X-ray spectrometry. FIG. 6D is a titanium mapping image of the sample of Example 3 by energy dispersive electron beam-excited X-ray spectrometry.

These images demonstrate that in every sample, a $TiO_2$ film as the first semiconductor film 43 remained even after the irradiation with third harmonic light.

Figure 7:
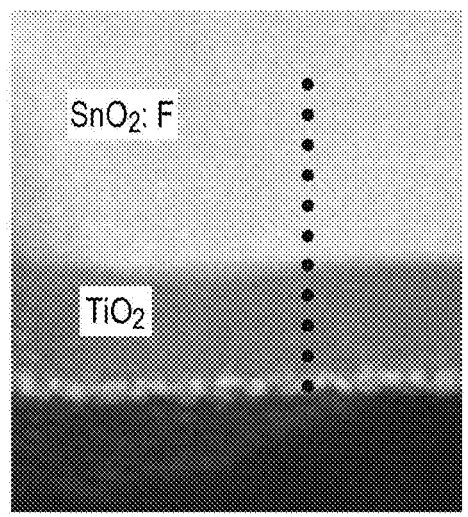
FIG. 7 is a cross-sectional TEM image of a sample of Comparative Example 1.
Figure 8:
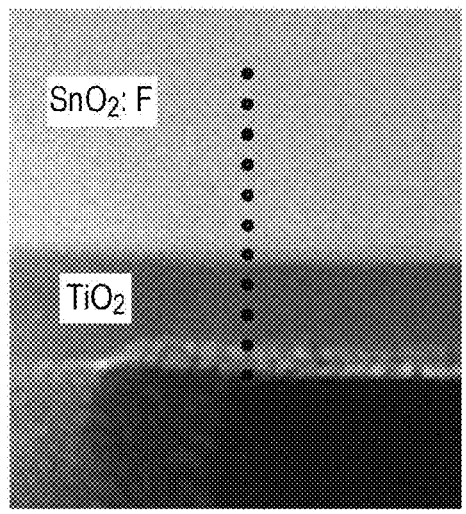
FIG. 8 is a cross-sectional TEM image of a sample of Example 1.
Figure 9:
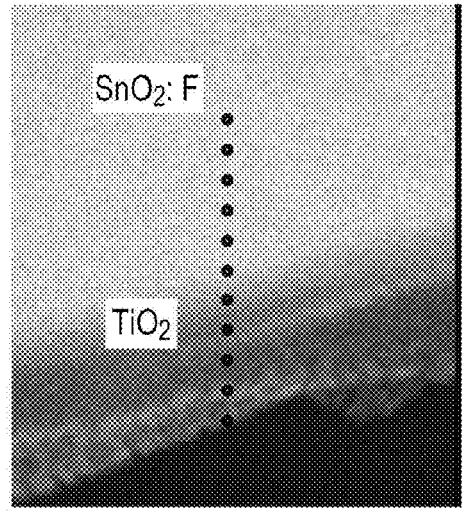
FIG. 9 is a cross-sectional TEM image of a sample of Example 2.

FIGS. 7 to 9 are cross-sectional TEM images of the samples of Comparative Example 1 and Examples 1 and 2, respectively. Each image shows an enlarged cross-section including the first electrode 42 and the first semiconductor junction 44 in the normal direction of the substrate 41. The black dots in each image indicate the analysis positions. The distances between the black dots are 5 nm.

As shown in FIGS. 7 to 9, the atomic number ratios of O, Ti, and Sn at a plurality of positions differing in the height from the surface of the substrate were determined by energy dispersive electron beam-excited X-ray spectrometry with a transmission electron microscope. The sample of Example 3 was also similarly analyzed (not shown). The analysis was performed on points 10 nm or more away from the surface of the first electrode 42. This is because that the signal from Sn contained in the first electrode 42 is prevented from being falsely detected as the signal from Sn in the first semiconductor film. This distance varies depending on the shape of the sample to be measured and the performance of the measuring apparatus and is not necessarily limited to 10 nm.

The number ratio Sn/(Ti+Sn) of impurity metal (herein, Sn) atoms to the metal atoms contained in the first semiconductor junction 44 in each of Examples and Comparative Examples was calculated from the results of analysis. Herein, the average of the atomic number ratios Sn/(Ti+Sn) at three points 10 nm or more away from the surface of the fluorine-doped tin oxide layer as the first electrode 42 was determined. The results are collectively shown in Table 1.

The results shown in Table 1 demonstrate that the concentration of Sn contained in the first semiconductor film 43 of each of Examples 1 to 3 irradiated with third harmonic light was higher than that in the first semiconductor film 43 of Comparative Example 1 not irradiated with light. This is probably caused by that in the sample of each Example, the first semiconductor film (herein, $TiO_2$ film) 43 absorbs third harmonic light and increases its temperature, and the heat heats the first electrode (herein, SnO:F film) 42 adjoining to the first semiconductor film 43, and a part of the Sn atoms diffuses into the first semiconductor film 43.

Evaluation of Resistivity R

Two samples of each of Examples and Comparative Examples were investigated for the resistance between the first electrode 42 and the second electrode 45 as follows.

In each sample, the value of resistance between adjacent two second electrodes 45 was measured. A graph with distance on the horizontal axis and value of resistance on the vertical axis was then drawn, and the resistivity R between the $SnO_2$:F film as the first electrode 42 and the Au film as the second electrode 45 was calculated from the y-axis intercept of an approximate straight line obtained by the least-square method.

TABLE 1

| | Conditions for producing sample | Resistivity R between first and second electrodes ($\Omega cm^2$) | | Atomic number ratio |
| --- | --- | --- | --- | --- |
| | | Sample 1 | Sample 2 | Sn/(Ti + Sn) |
| Example 1 | 3rd harmonic light 0.1 W | 0.184 | 0.141 | 0.009 |
| Example 2 | 3rd harmonic light 0.2 W | 0.114 | 0.103 | 0.075 |

TABLE 1-continued

| | Conditions for producing sample | Resistivity R between first and second electrodes (Ωcm²) | | Atomic number ratio |
|---|---|---|---|---|
| | | Sample 1 | Sample 2 | Sn/(Ti + Sn) |
| Example 3 | 3rd harmonic light 0.5 W | 0.090 | 0.087 | 0.103 |
| Comparative Example 1 | No irradiation with 3rd harmonic light | 0.261 | 0.268 | 0.006 |
| Comparative Example 2 | No 1st semiconductor film No irradiation with 3rd harmonic light | 0.104 | 0.097 | — |

As shown in Table 1, in Examples 1 to 3, the number ratio of impurity metal (herein, Sn) atoms in the first semiconductor junction 44 was increased compared to Comparative Example 1 where irradiation with third harmonic light was not performed. This demonstrates that Sn atoms are diffused in the first semiconductor film 43 by irradiating the first semiconductor film 43 with third harmonic light.

It was demonstrated that the atomic number ratio of Sn in the first semiconductor junction 44 increases with the irradiation light power of third harmonic light, resulting in a reduction in the resistivity R between the first and second electrodes. In particular, the resistivities R in Examples 2 and 3 were approximately the same as that of the sample of Comparative Example 2 where the first electrode 42 and the second electrode 45 were in direct contact with each other. That is, in particular, the resistivities R in Examples 2 and 3 were approximately the same as that of the sample of Comparative Example 2 where the first semiconductor film was not interposed between the first electrode 42 and the second electrode 45.

Threshold of Atomic Number Ratio of Impurity Metal in First Semiconductor Junction 44

The threshold of the atomic number ratio, which is the proportion of the impurity metal (herein, Sn) atoms relative to the metal atoms in the first semiconductor junction 44, was investigated by using different impurity metals.

Samples of Examples 4 and 5 were produced as in the sample of Example 1 with reference to FIGS. 2 and 3 except that the material of the first semiconductor film and the method of forming the film were changed. The material of the first semiconductor film 43 and the method of forming the film in each Example are as follows. A plurality of samples were produced as the samples of each Example by changing the concentration of the impurity metal.

Example 4

A TiO₂ film (thickness: 30 nm) containing Sn as an impurity was formed as the first semiconductor film 43. The first semiconductor film 43 was formed by simultaneously depositing TiO₂ and Sn as the impurity metal on a substrate by sputtering. A part of the first semiconductor film 43 was then irradiated with third harmonic light to form a first semiconductor junction 44 containing Sn.

Example 5

A TiO₂ film (thickness: 30 nm) containing Nb as an impurity was formed as the first semiconductor film 43. The first semiconductor film 43 was formed by simultaneously depositing TiO₂ and Nb as the impurity metal on a substrate by sputtering. A part of the first semiconductor film 43 was then irradiated with third harmonic light to form a first semiconductor junction 44 containing Nb.

Relationship Between Atomic Number Ratio of Impurity Metal and Resistivity R Between Electrodes The samples of Examples 4 and 5 each including the above-described first semiconductor film 43 were subjected to TEM-EDX analysis, and the number ratio of the impurity metal atoms to the metal atoms contained in the first semiconductor film 43 was calculated. The resistivity R between the SnO₂:F film as the first electrode 42 and the Au film as the second electrode 45 was also determined. The resistivity R was calculated by the same method as that for the samples of Example 1 and so on. A desirable range of the atomic number ratio was then investigated from the relationship between the number ratio of the impurity metal atoms and the resistivity R between the electrodes.

Figure 10:
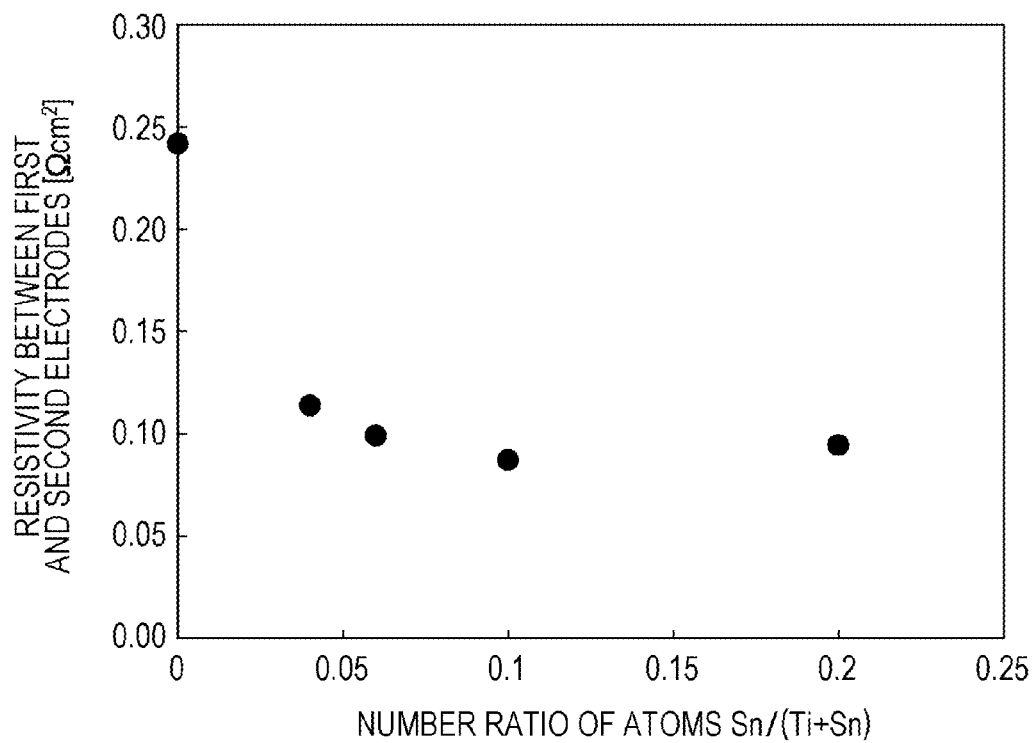
FIG. 10 is a graph showing a relationship between the number ratio Sn/(Ti+Sn) of the impurity metal atoms and the resistivity R between the electrodes in a sample of Example 4.
Figure 11:
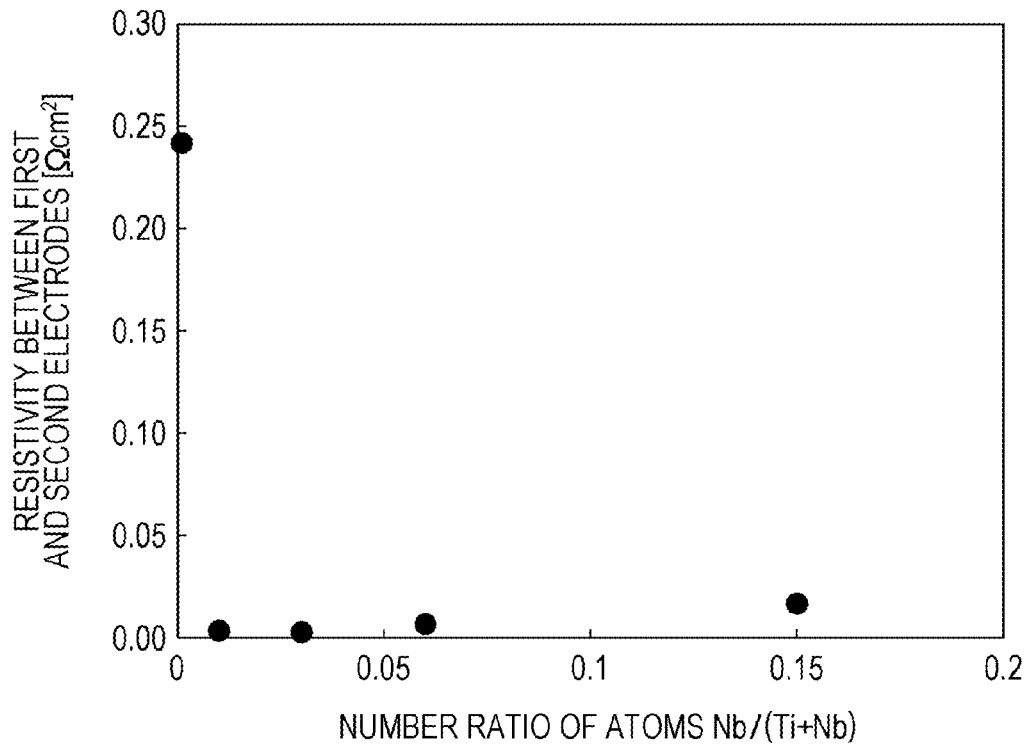
FIG. 11 is a graph showing a relationship between the number ratio Nb/(Ti+Nb) of the impurity metal atoms and the resistivity R between the electrodes in a sample of Example 5.
Figure 12:
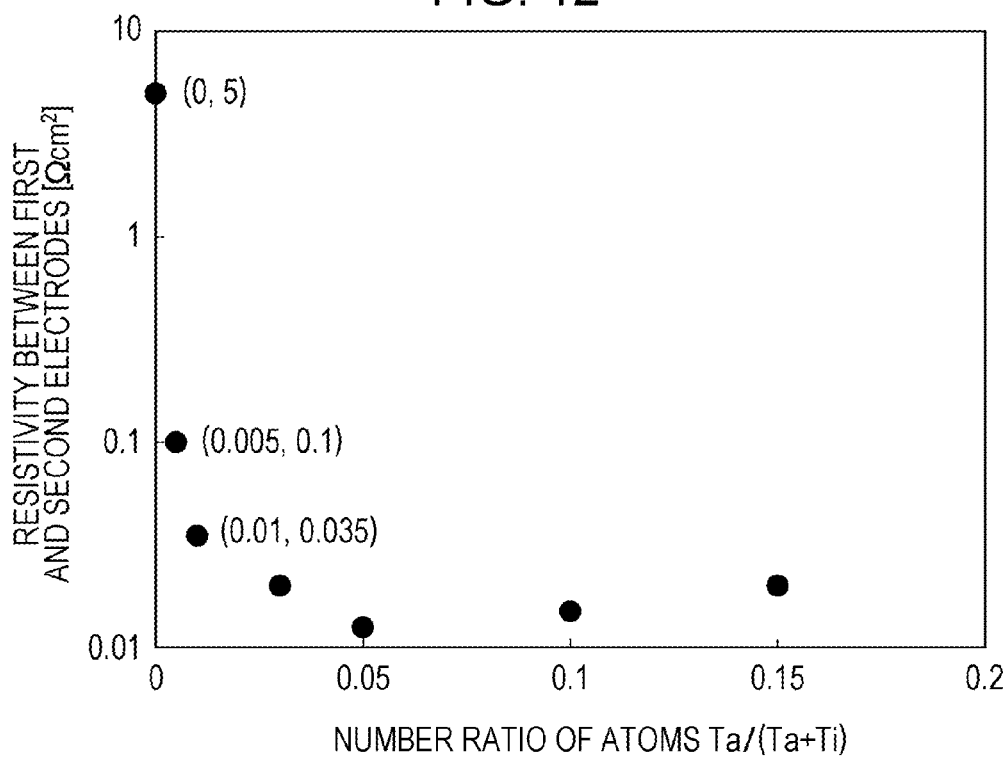
FIG. 12 is a graph showing a relationship between the number ratio Ta/(Ti+Ta) of the impurity metal atoms and the resistivity R between the electrodes in a sample of Example 6.
Figure 13:
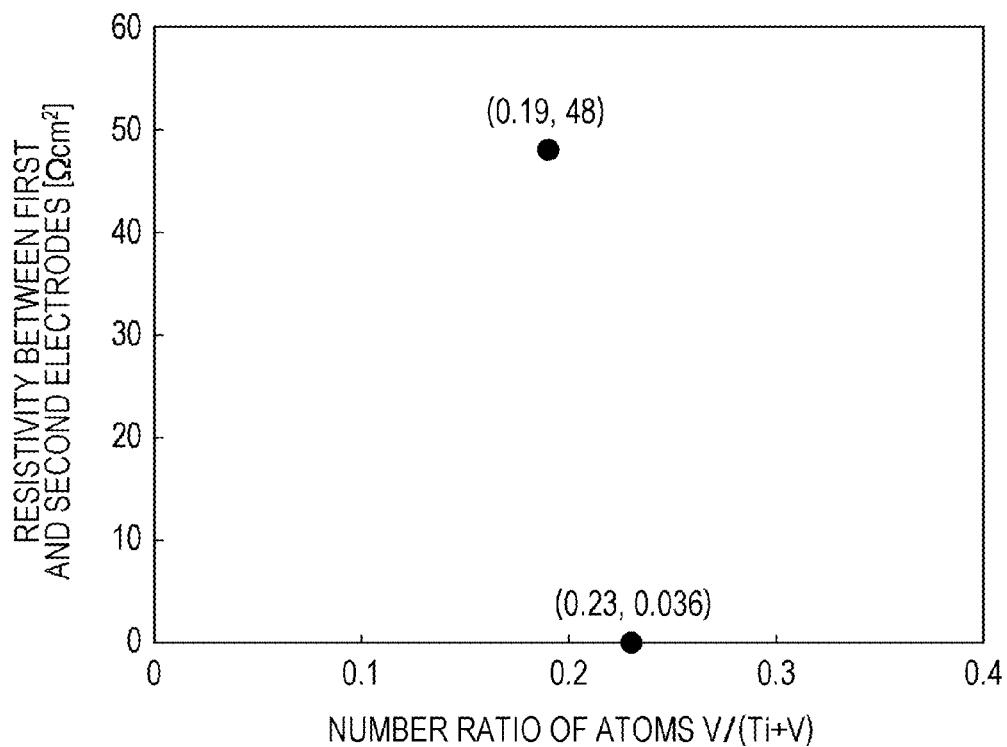
FIG. 13 is a graph showing a relationship between the number ratio V/(Ti+V) of the impurity metal atoms and the resistivity R between the electrodes in a sample of Example 7.
Figure 14:
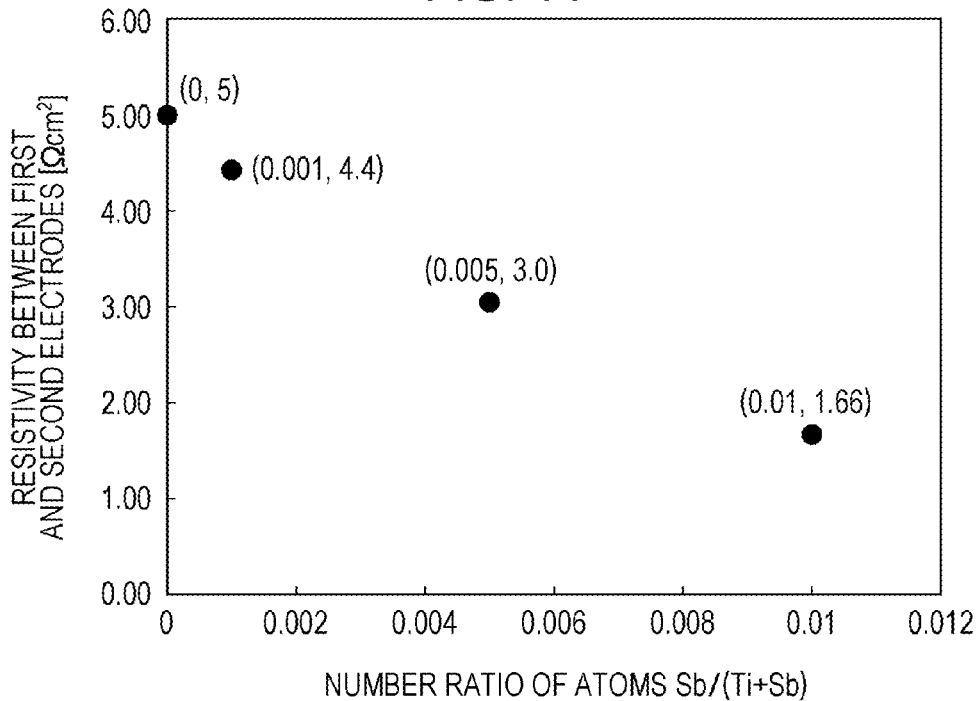
FIG. 14 is a graph showing a relationship between the number ratio Sb/(Ti+Sb) of the impurity metal atoms and the resistivity R between the electrodes in a sample of Example 8.
Figure 15:
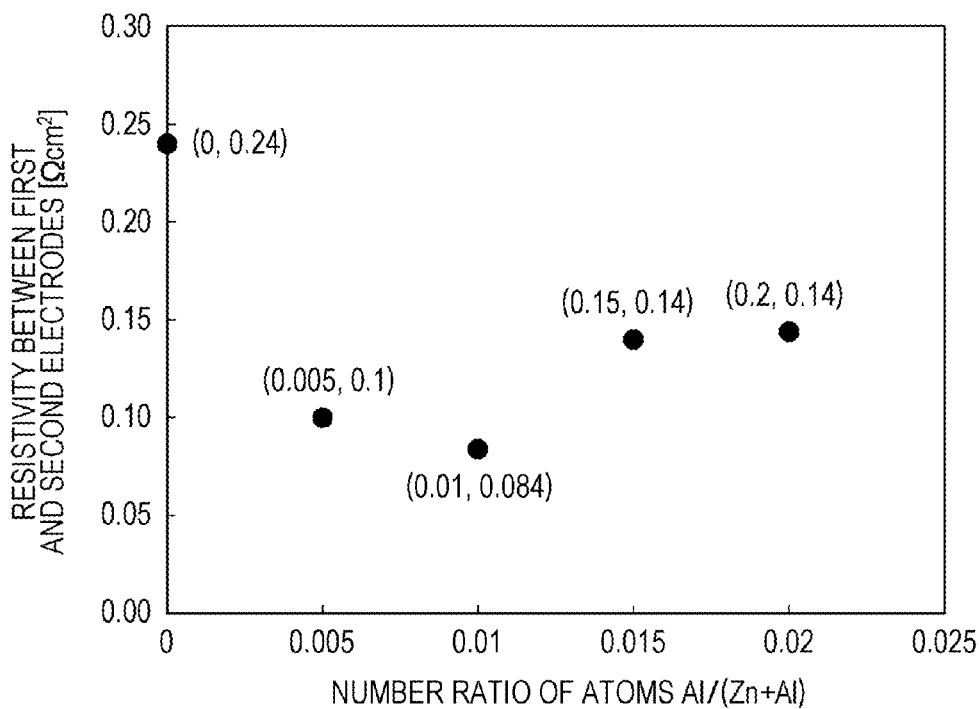
FIG. 15 is a graph showing a relationship between the number ratio Al/(Zn+Al) of the impurity metal atoms and the resistivity R between the electrodes in a sample of Example 9.
Figure 18:
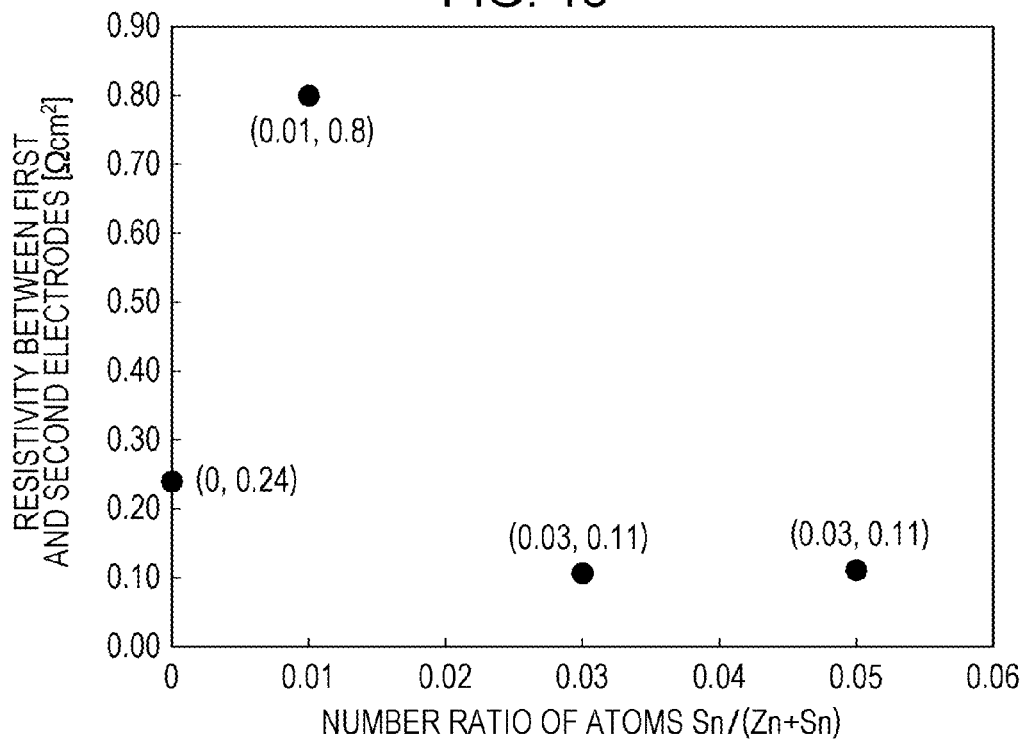
FIG. 18 is a graph showing a relationship between the number ratio Sn/(Zn+Sn) of the impurity metal atoms and the resistivity R between the electrodes in a sample of Example 12.
Figure 19:
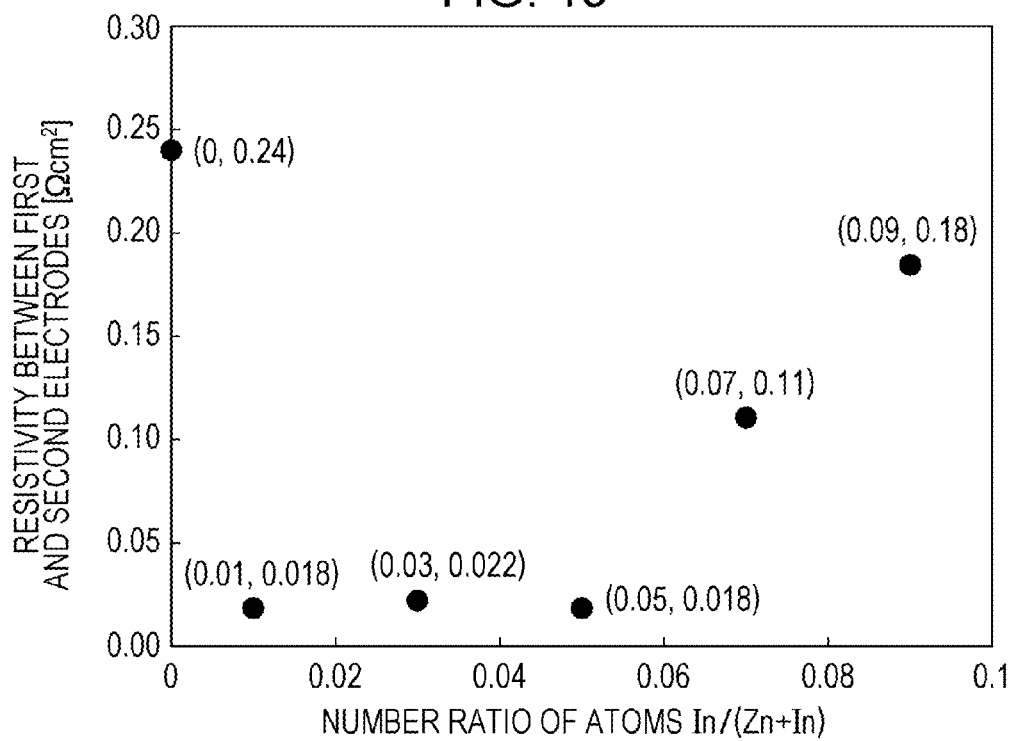
FIG. 19 is a graph showing a relationship between the number ratio In/(Zn+In) of the impurity metal atoms and the resistivity R between the electrodes in a sample of Example 13.
Figure 20:
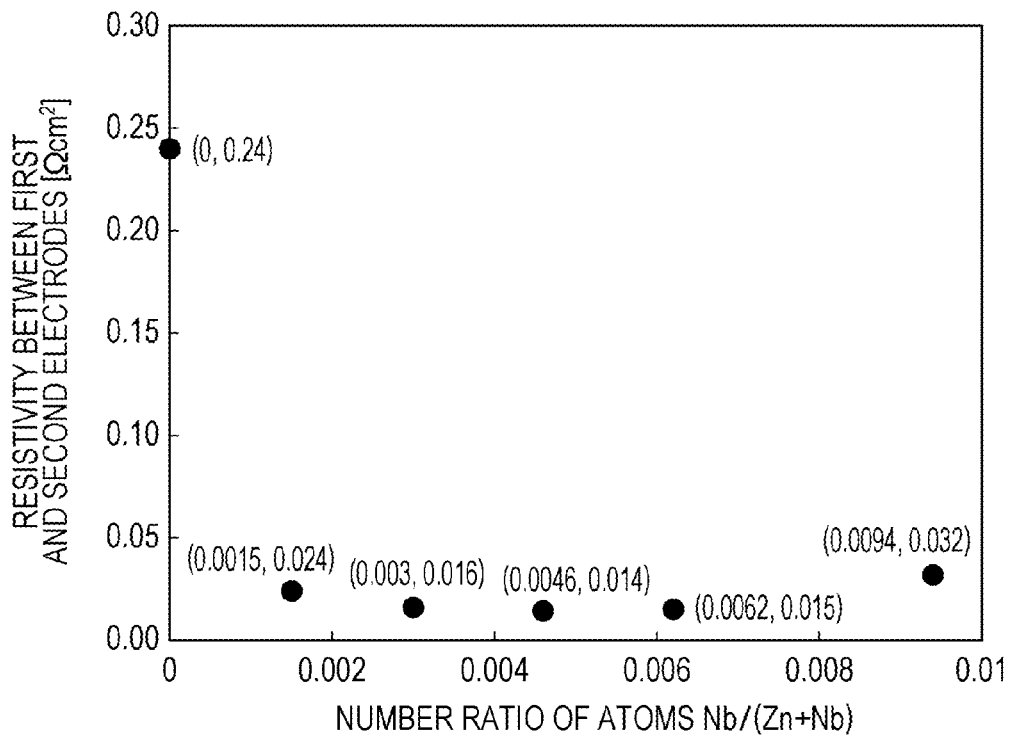
FIG. 20 is a graph showing a relationship between the number ratio Nb/(Zn+Nb) of the impurity metal atoms and the resistivity R between the electrodes in a sample of Example 14.
Figure 21:
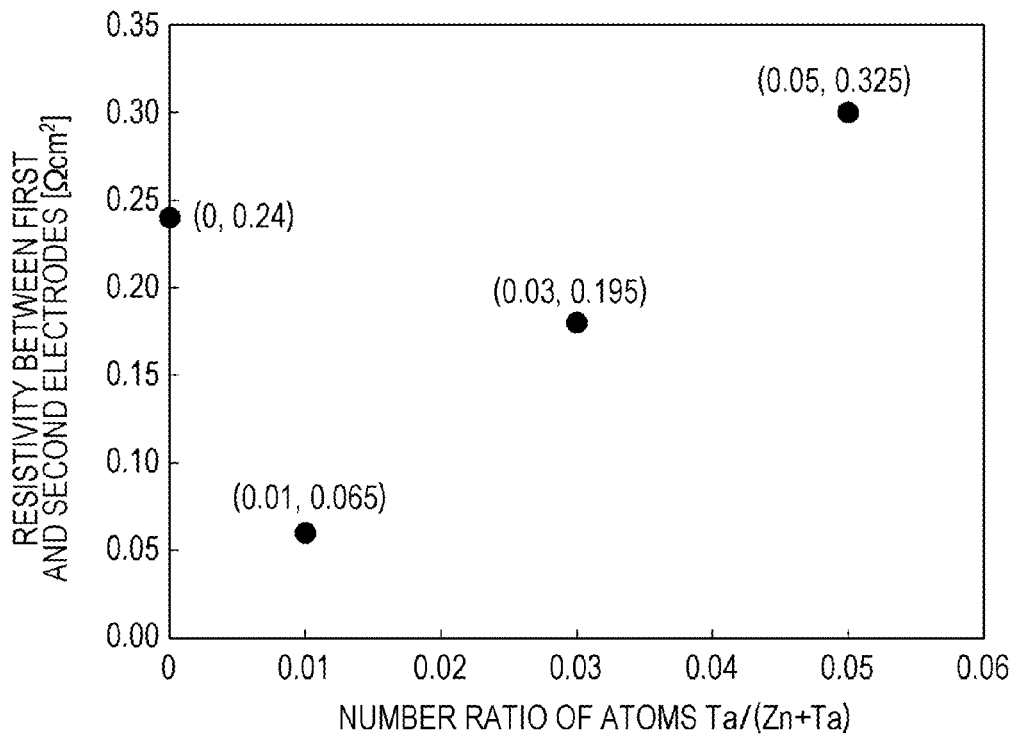
FIG. 21 is a graph showing a relationship between the number ratio Ta/(Zn+Ta) of the impurity metal atoms and the resistivity R between the electrodes in a sample of Example 15.
Figure 22:
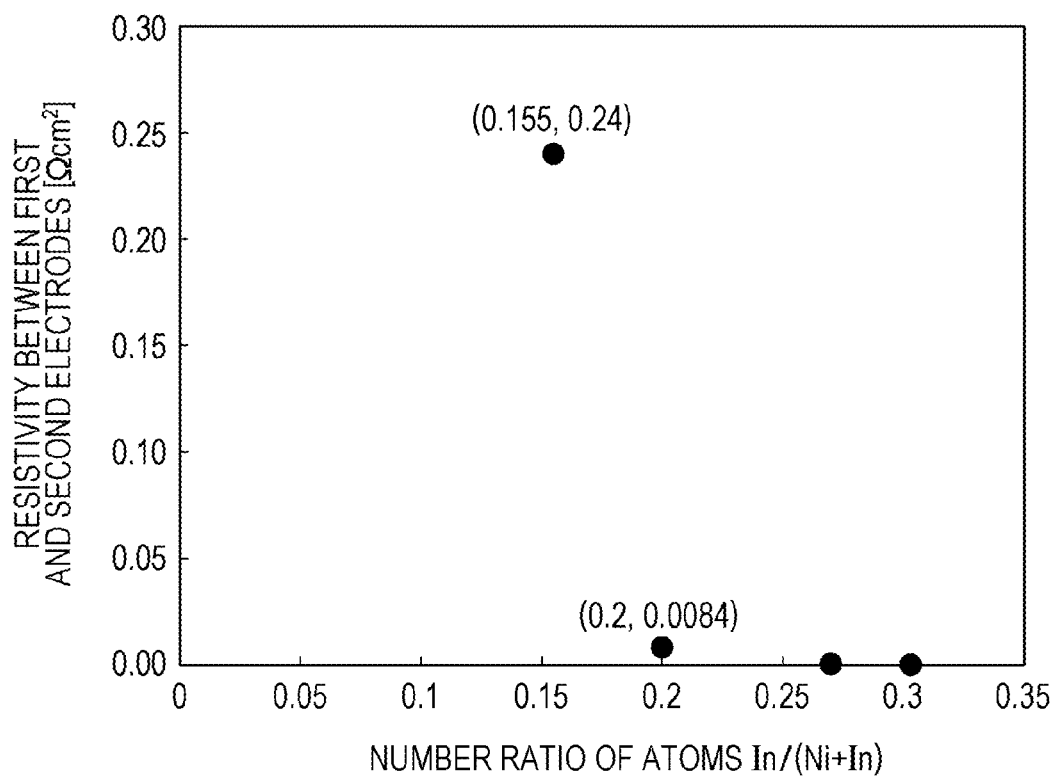
FIG. 22 is a graph showing a relationship between the number ratio In/(Ni+In) of the impurity metal atoms and the resistivity R between the electrodes in a sample of Example 16.

FIG. 10 is a graph showing a relationship between the number ratio of the impurity metal atoms and the resistivity R between the electrodes in the sample of Example 4. FIG. 11 is a graph showing a relationship between the number ratio of the impurity metal atoms and the resistivity R between the electrodes in the sample of Example 5.

The results shown in FIGS. 10 and 11 demonstrate that the number ratio of the impurity metal atoms in the first semiconductor junction 44 is desirably, for example, in the range shown in Table 2 for more effectively reducing the resistivity R. If the atomic number ratio is within the range shown in Table 2, the resistivity R can be reduced to, for example, about a half or less. It was also demonstrated that sufficient electric resistance can be obtained in the region of the first semiconductor film 43 excluding the first semiconductor junction 44, if the number ratio of the impurity metal atoms is, for example, within the range shown in Table 2. The number ratio of the impurity metal atoms in the region of the first semiconductor film 43 excluding the first semiconductor junction 44 may be zero.

TABLE 2

| | Main component of first semiconductor film | Impurity metal of first semiconductor film | Atomic number ratio of impurity metal in first semiconductor junction | Atomic number ratio of impurity metal in portion other than first semiconductor junction |
|---|---|---|---|---|
| Example 4 | Titanium oxide | Sn | ≥3% | <1% |
| Example 5 | | Nb | ≥1% | <0.05% |

Other Examples

As Examples 6 to 16, first semiconductor films 43 and impurity metals different from those in the above-described Examples were used for investigating desirable ranges of number ratios of impurity metal atoms in the first semiconductor junction 44. Examples 6 to 16 will be described below.

Table 3 shows the first semiconductor films 43 and the impurity metals in Examples 6 to 16. In these Examples, the relationship between the number ratio of impurity metal atoms and the resistivity R between the first and second electrodes was calculated with reference to documents relating to elemental substitution.

The documents referred in calculation of the relationship between the atomic number ratio and the resistivity R in the Examples are as follows.

Example 6

First semiconductor film 43: titanium oxide
Dopant: tantalum
Document: Taro HITOSUGI and nine other authors, "Japanese Journal of Applied Physics" (Japan), 2005, Vol. 44, No. 34, pp. L1063-L1065, DOI:10.1143/JJAP.44.L1063
FIG. 2 of this document describes the dependency of resistivity on the amount of doped Ta when $TiO_2$ is doped with Ta.

Example 7

First semiconductor film 43: titanium oxide
Dopant: vanadium
Document: K. SIERADZKA and four other authors, "ACTA PHYSICA, POLONICA A" (Poland), December 2009, Vol. 116, pp. S-33-S-35, DOI: HYPERLINK, http://dx.doi.org/10.12693/APhysPolA.116.S-33" 10.12693/APhysPolA.116.S-33
Table III of this document indicates that a resistivity of $6 \times 10^2$ Ωcm can be obtained by introducing vanadium at an atomic number concentration of 19% relative to $TiO_2$.

Example 8

First semiconductor film 43: titanium oxide
Dopant: antimony
Document: Toshinobu YOKO and four other authors, "Nippon Kagaku Kaishi" (Japan), May 1987, No. 11, pp. 1946-1951
Table 2 of this document indicates that the value of resistance is decreased to one-third by introducing antimony at an atomic number concentration of 1% relative to titanium.

Example 9

First semiconductor film 43: zinc oxide
Dopant: aluminum
Document: Min-Chul Jun and two other authors, "Nanoscale Research Letters" (Germany), November 2012, Vol. 7, p. 639, DOI:10.1186/1556-276X-7-639
FIG. 4 of this document indicates that the value of sheet resistance is decreased from 12 kΩ/sq to 5 kΩ)/sq by introducing aluminum at an atomic number concentration of 0.5% relative to zinc.

Example 10

First semiconductor film 43: zinc oxide
Dopant: boron
Document: Chien-Yie Tsay and one other author, "Ceramics International" (Netherlands), 2013, Vol. 39, pp. 7425-7432, DOI:10.1016/j.ceramint.2013.02.086
FIG. 6 of this document indicates that the resistivity is decreased from $6 \times 10^3$ Ωcm to $2 \times 10^2$ Ωcm by introducing boron at an atomic number concentration of 1% relative to zinc.

Example 11

First semiconductor film 43: zinc oxide
Dopant: gallium
FIG. 4 of the document referred in Example 9 indicates that the value of sheet resistance is decreased from 12 kΩ/sq to 6 kΩ/sq by introducing gallium at an atomic number concentration of 1% relative to zinc.

Example 12

First semiconductor film 43: zinc oxide
Dopant: tin
Document: SEVAL AKSOY and three other authors, "Optica Applicata" (Poland), 2010, Vol. XL, No. 1, pp. 7-14
FIG. 6 of this document indicates an increase in conductivity (i.e., a reduction in resistivity) by doping with tin at an atomic number concentration of 3%, compared to the conductivity when the doping is not performed.

Example 13

First semiconductor film 43: zinc oxide
Dopant: indium
Document: Sh. El Yamny and one other author, "Journal of Modern Physics" (China), 2012, Vol. 3, pp. 1060-1069, DOI:10.4236/jmp.2012.39140
FIG. 10 of this document indicates that the resistivity is decreased from 325 Ωcm to 25 Ωcm by introducing indium at an atomic number concentration of 1% relative to zinc.

Example 14

First semiconductor film 43: zinc oxide
Dopant: niobium
Document: Jingzhen Shao and eight other authors, "Thin Solid Films" (Netherlands), 2010, Vol. 518, pp. 5288-5291, DOI:10.1016/j.tsf.2010.04.068
FIG. 5 of this document indicates that the resistivity is decreased by one digit by introducing niobium at an atomic number concentration of 0.15% relative to zinc.

Example 15

First semiconductor film 43: zinc oxide
Dopant: tantalum
Document: K. Ravichandran and three other authors, "Journal of Alloys and Compounds" (Netherlands), 2016, Vol. 656, pp. 332-338, DOI:10.1016/j.tsf.2010.04.068
FIG. 2 of this document indicates that the resistivity is decreased to one-fourth by introducing tantalum at an atomic number concentration of 1% relative to zinc.

Example 16

First semiconductor film 43: nickel oxide
Dopant: indium
Document: Sheng-Chi Chen and five other authors, "Journal of Vacuum Science Technology A" (USA), 2014, Vol. 32, No. 2, 0213118, DOI:10.1116/1.4865808
FIG. 4 of this document indicates that the resistivity is decreased by one digit by introducing indium at an atomic number concentration of 20% relative to nickel.

In Examples 6 and 8, the resistivity of a TiO$_2$ film against the dopant concentration was calculated using a resistivity of 8×10$^4$ Ωcm as that of a TiO$_2$ film (thickness: 30 nm) not containing any impurity and based on the resistance value changing rate due to the dopant specified in the above-mentioned document. In Example 7, since the resistivity of a TiO$_2$ film (thickness: 30 nm) not containing any impurity is not specified in the above-mentioned document, the resistivity measured by the inventor was used.

In Examples 9 to 15, the resistivity of a ZnO film against the dopant concentration was calculated using a resistivity of 6×10$^4$ Ωcm as that of a ZnO film (thickness: 20 nm) not containing any impurity and based on the resistance value changing rate due to the dopant specified in the above-mentioned document.

In Example 16, the resistivity of a NiO film against the dopant concentration was calculated using a resistivity of 700 Ωcm as that of a NiO film (thickness: 20 nm) not containing any impurity and based on the resistance value changing rate due to the dopant specified in the above-mentioned document.

FIGS. 12 to 22 are graphs each showing a relationship between the number ratio of impurity metal atoms and the resistivity R between the electrodes in Examples 6 to 16.

These results of calculation suggest that the number ratio of impurity metal atoms of the first semiconductor junction 44 is desirably, for example, within the range shown in Table 3 for more effectively reducing the resistivity R.

From these results, it is conceivable that the effect of reducing resistivity R also depends on the combination of the material of the first semiconductor film 43 and the impurity metal atoms and that the desirable range of the number ratio of the impurity metal atoms also varies depending on the combination.

Furthermore, it is suggested that a certain effect can be obtained when the number ratio of the impurity metal atoms in the first semiconductor junction 44 is, for example, 0.9% or more and the number ratio of the impurity metal atoms in the region other than the first semiconductor junction 44 is, for example, less than 0.5%, regardless of the material of the first semiconductor film 43 and the impurity metal.

In every case, if the number ratio of the impurity metal atoms in the first semiconductor junction 44 is too high, the impurity metal diffuses also to a region other than the first semiconductor junction 44, resulting in a risk of reducing the resistance of this region. In order to effectively prevent such a reduction in resistance, the number ratio of the impurity metal atoms in the first semiconductor junction 44 may be, for example, 30% or less. In the case where the main component of the first semiconductor film 43 is titanium oxide or zinc oxide, it is conceivable that the above-described reduction in resistance can be prevented if the number ratio is, for example, 10% or less.

Method of Providing Impurity Metal to First Semiconductor Film

Samples having the structure shown in FIG. 2 were produced by applying a solution containing metal atoms to a part of the first semiconductor film, and the characteristics thereof were evaluated.

The samples of Examples 17 to 19 were produced as follows.

Examples 17 to 19

As in Example 1, a 200-mm-square glass substrate having a thickness of 0.5 mm was used as the substrate 1. On the substrate 1, a fluorine-doped tin oxide layer was disposed as the first electrode film. A first semiconductor film (TiO$_2$ film having a thickness of 30 nm) 43 was formed on the first electrode film. A solution containing an impurity metal (herein, Nb) was then applied onto the first semiconductor film 43. Herein, a solution of 10% niobium pentaisopropoxide in isopropyl alcohol was applied onto the first semiconductor film 43 by spin coating. The application by spin coating was performed at a rotation speed of 6000 rpm for 30 seconds.

TABLE 3

| | Main component of first semiconductor film | Thickness of first semiconductor film | Impurity metal of first semiconductor film | Atomic number ratio of impurity metal in first semiconductor junction | Atomic number ratio of impurity metal in portion other than first semiconductor junction |
|---|---|---|---|---|---|
| Example 6 | Titanium oxide | 30 nm | Ta | ≥0.5% | <0.1% |
| Example 7 | | 30 nm | V | ≥23% | <19% |
| Example 8 | | 30 nm | Sb | ≥1% | <0.1% |
| Example 9 | Zinc oxide | 20 nm | Al | ≥0.5% | <0.1% |
| Example 10 | | 20 nm | B | ≥1% but ≤3% | <0.1% |
| Example 11 | | 20 nm | Ga | ≥1% | <0.1% |
| Example 12 | | 20 nm | Sn | ≥3% | <0.1% |
| Example 13 | | 20 nm | In | ≥1% but ≤7% | <0.1% |
| Example 14 | | 20 nm | Nb | ≥0.15% | <0.1% |
| Example 15 | | 20 nm | Ta | 1% | <0.1% |
| Example 16 | Nickel oxide | 20 nm | In | ≥20% | <0.1% |

As shown in FIG. 3, predetermined regions of the first semiconductor film 43 were irradiated with third harmonic light of a YAG laser. The conditions for irradiation with third harmonic light of a YAG laser were a repetition frequency of 300 kHz, a substrate moving speed of 1000 mm/sec during irradiation, an irradiation time of 50 ps, an irradiation spot diameter of 36 μm, and an irradiation light power of 0.1 W. Thus, a first semiconductor film 43 containing niobium as an impurity was formed. A second electrode 45 was then provided as in Example 1 to prepare a sample of Example 17.

Samples of Examples 18 and 19 were produced as in Example 17 except that the irradiation light power of the YAG laser irradiation was 0.2 W in Example 18 and 0.5 W in Example 19.

Evaluation of Resistivity R Between First Electrode and Second Electrode

Regarding the samples of Examples 17 to 19, the resistivity R between the electrodes was determined as in Example 1. The results are shown in Table 4. Table 4 also shows the results of Examples 1 to 3 for comparison.

TABLE 4

| | | Resistivity R between first and second electrodes ($\Omega cm^2$) | |
|---|---|---|---|
| | Conditions for producing sample | Sample 1 | Sample 2 |
| Example 1 | Third harmonic light 0.1 W | 0.184 | 0.141 |
| Example 2 | Third harmonic light 0.2 W | 0.114 | 0.103 |
| Example 3 | Third harmonic light 0.5 W | 0.090 | 0.087 |
| Example 17 | Third harmonic light 0.1 W | 0.135 | 0.120 |
| Example 18 | Third harmonic light 0.2 W | 0.098 | 0.108 |
| Example 19 | Third harmonic light 0.5 W | 0.092 | 0.087 |

As obvious from Table 4, the sample of Example 17 had a lower resistivity R than that of the sample of Example 1 where the irradiation light power was the same but Nb was not applied onto the first semiconductor film 43. Similarly, the samples of Examples 18 and 19 had resistivities R equal to or lower than those of the samples of Examples 2 and 3, respectively. As described above, the first semiconductor junctions 44 of Examples 1 to 3 contain Sn diffused from the first electrode 42 as the impurity metal. In contrast, in Examples 17 to 19, it is conceivable that the first semiconductor junction 44 contains Nb applied from the outside as the impurity metal, in addition to Sn diffused from the first electrode 42. It is consequently surmised that the number ratio of impurity metal atoms is increased, resulting in a reduction in the resistivity R.

It is accordingly conceivable that application of a solution containing metal atoms onto the first semiconductor film 43 can add not only the metal atoms contained in the first electrode 42 but also a desired metal atoms to the first semiconductor film.

Evaluation of Characteristics of Solar Cell

Solar cells of Example 20 and Comparative Example 3 were produced, and the characteristics thereof were evaluated.

Solar Cell of Example 20

A solar cell of Example 20 having the above-described structure was produced with reference to FIG. 1. The material of each component is as follows:

Substrate 1: Glass
First electrode film 2: fluorine-doped tin oxide having a thickness of 0.7 μm (sheet resistance: 10 Ω/sq)
First semiconductor film 3: anatase-type titanium oxide
Second semiconductor film 4: $CH_3NH_3PbI_3$
Third semiconductor film 5: Spiro-OMeTAD
Second electrode film 6: gold The solar cell of Example 20 was produced by the following method. A 200-mm-square glass substrate having a thickness of 0.5 mm was used as the substrate 1. On the substrate 1, a fluorine-doped tin oxide layer was disposed as the first electrode film. A titanium oxide layer having a thickness of 30 nm was formed as the first semiconductor film on the first electrode film by sputtering.

First dividing grooves 7 dividing the first electrode film 2 and the first semiconductor film 3 were then formed. Herein, laser scribing with YAG laser fundamental wave light (wavelength: 1065 nm) was carried out at a line width of 50 μm and a line spacing of 5 mm. Consequently, the first electrode film 2 and the first semiconductor film 3 were each divided into 37 rectangular strips. The length in the longitudinal direction of the strip was 200 mm.

The subsequent processes from formation of the second semiconductor film 4 to evaluation were carried out in a dry room having a dew point of −30° C.

The second semiconductor film 4 was formed on the first semiconductor film 3 and in the first dividing grooves 7. Herein, 10 mL of a solution prepared by dissolving 25 g of $PbI_2$ and 8.56 g of $CH_3NH_3I$ in 77.6 mL of dimethyl sulfoxide (DMSO) was applied onto the substrate by spin coating (2000 rpm, 3 min). During the spin coating, 5 mL of toluene was dropwise added. Heat treatment with a hot plate of 125° C. was then performed for 10 minutes to form a $CH_3NH_3PbI_3$ film having a thickness of 0.5 μm as the second semiconductor film 4.

Subsequently, the third semiconductor film 5 was formed on the second semiconductor film 4. Herein, a solution was prepared by adding 0.4 mL of an acetonitrile solution containing 1.8 mol/L lithium bis(trifluoromethanesulfonyl) imide (hereinafter, referred to as LiTFSI), 0.4 mL of an acetonitrile solution containing 1.6 mol/L 1.6N—$CoPF_6$, and 2.5 mL of tert-butylpyridine to 82 mL of a chlorobenzene solution containing 60 mmol/L Spiro-OMeTAD, and 5 mL of the resulting solution was applied onto the second semiconductor film 4 by spin coating. Consequently, a third semiconductor film 5 having a thickness of 0.3 μm and mainly composed of Spiro-OMeTAD was formed.

Second dividing grooves 8 dividing the second semiconductor film 4 and the third semiconductor film 5 were formed. Herein, the second semiconductor film 4 and the third semiconductor film 5 were removed by performing mechanical scribing four times with a scribing blade having a blade width of 50 μm. Consequently, the second dividing grooves 8 having a scribing width of 200 μm were respectively formed at positions separated by 50 μm from the end of the corresponding first dividing grooves 7. In the second dividing groove 8, the surface of the first semiconductor film 3 was exposed.

The portion of the first semiconductor film 3 exposed at the second dividing groove 8 was irradiated with laser light to heat the portion. Herein, the exposed surface of the first semiconductor film 3 was irradiated with third harmonic light of a YAG laser. The irradiation with third harmonic light of a YAG laser was performed under the conditions of a repetition frequency of 300 kHz, a substrate moving speed of 1000 mm/sec during irradiation, an irradiation time of 50 ps, an irradiation spot diameter of 36 μm, and an irradiation light power of 0.2 W.

A second electrode film 6 was then formed on the third semiconductor film 5 and in the second dividing grooves 8. Herein, an Au film was deposited to form the second electrode film 6 having a thickness of 200 nm.

Third dividing grooves 9 dividing the second semiconductor film 4, the third semiconductor film 5, and the second electrode film 6 were then formed. The third dividing grooves were also formed by mechanical scribing as in the first dividing grooves and the second dividing grooves. Herein, the third dividing grooves 9 having a width of 50 μm were respectively formed at positions separated by 50 μm from the end of the corresponding second dividing grooves 8. Thus, a solar cell of Example 20 including 35 unit cells connected in series was produced.

Solar Cell of Comparative Example 3

A solar cell of Comparative Example 3 was produced as in Example 20 except that the irradiation of the portion of the first semiconductor film 3 exposed in the second dividing groove 8 with third harmonic light of a YAG laser was not performed.

Evaluation of Photoelectric Conversion Characteristics

The photoelectric conversion characteristics of the solar cells of Example 20 and Comparative Example 3 were evaluated. Herein, each of the solar cells was irradiated with artificial solar light having an optical intensity of 1 kW/m$^2$, and the current-voltage characteristics were measured. The results are shown in FIG. 23.

Figure 23:
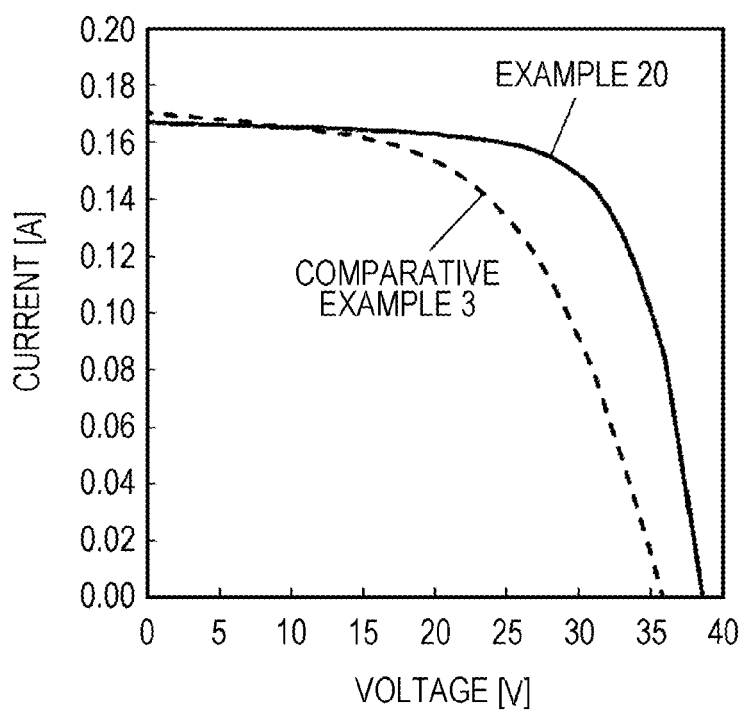
FIG. 23 is a graph showing output characteristics of a solar cell of Example 20 and a solar cell of Comparative Example 3.

The open circuit voltage Voc, short-circuit current density Jsc, fill factor FF, and conversion efficiency PCE of each of the solar cells were determined from the current-voltage characteristics shown in FIG. 23. The results are shown in Table 5.

TABLE 5

| | Voc (V) | Jsc (mA/cm$^2$) | FF | PCE (%) |
|---|---|---|---|---|
| Example 20 | 1.102 | 18.12 | 0.692 | 12.6 |
| Comparative Example 3 | 1.024 | 18.47 | 0.547 | 9.42 |

The results shown in FIG. 23 and Table 5 demonstrate that the fill factor FF and the conversion efficiency PCE of the solar cell of Example 20 were considerably improved compared to those of the solar cell of Comparative Example 3. This is probably caused by that in Example 20, the metal atoms (herein, Sn atoms) in the first electrode film 2 diffuse to the portion of the first semiconductor film 3 located in each second dividing groove 8 during the process of irradiation with third harmonic light to reduce the electric resistance at the portion.

The solar cell module according to an embodiment of the present disclosure is useful as a photovoltaic element or an optical sensor.

What is claimed is:

1. A solar cell module comprising:
   a substrate;
   a first unit cell on the substrate; and
   a second unit cell on the substrate, the second unit cell being connected to the first unit cell in series, wherein the first unit cell and the second unit cell each include:
      a first electrode on the substrate;
      a first semiconductor layer stacked on the first electrode in a first direction, the first semiconductor layer comprising a first portion and a second portion other than the first portion, the first semiconductor layer containing an oxide of a first metal, wherein the first and second portions are distributed in the first semiconductor layer in a second direction, wherein the second direction is perpendicular to the first direction;
      a second semiconductor layer on the first semiconductor layer; and
      a second electrode on the second semiconductor layer,
   a part of the second electrode of the first unit cell is located in a groove that separates the second semiconductor layer of the first unit cell from the second semiconductor layer of the second unit cell, the groove and the first portion entirely overlapping each other in a plan view,
   the second electrode of the first unit cell is electrically connected to the first electrode of the second unit cell via the first portion of the first semiconductor layer of the second unit cell,
   the first portion contains a second metal different from the first metal, and
   a first ratio of a number of atoms of the second metal to a number of atoms of all metals in the first portion is greater than a second ratio of a number of atoms of the second metal to a number of atoms of all metals in the second portion.

2. The solar cell module according to claim 1, wherein the first electrode contains atoms of the second metal.

3. The solar cell module according to claim 2, wherein the first electrode contains an oxide of the atoms of the second metal.

4. The solar cell module according to claim 1, wherein the first ratio is 0.9% or more and the second ratio is less than 0.5%.

5. The solar cell module according to claim 1, wherein the first metal is titanium.

6. The solar cell module according to claim 1, wherein the second metal is tin.

7. The solar cell module according to claim 1, wherein the second semiconductor layer comprises a plurality of semiconductor layers.

* * * * *